US012796242B2

(12) United States Patent
Lee et al.

(10) Patent No.: US 12,796,242 B2
(45) Date of Patent: Nov. 10, 2026

(54) DISPLAY PANEL AND ELECTRONIC APPARATUS INCLUDING THE SAME

(71) Applicant: Samsung Display Co., Ltd., Yongin-si (KR)

(72) Inventors: Jeongho Lee, Yongin-si (KR); Deokhoi Kim, Yongin-si (KR); Zail Lhee, Yongin-si (KR); Reehyang Kim, Yongin-si (KR); Swaehyun Kim, Yongin-si (KR); Jongbaek Seon, Yongin-si (KR); Hyejin Jang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 353 days.

(21) Appl. No.: 18/662,862

(22) Filed: May 13, 2024

(65) Prior Publication Data

US 2024/0389404 A1 Nov. 21, 2024

(30) Foreign Application Priority Data

May 15, 2023 (KR) ........................ 10-2023-0062700
May 31, 2023 (KR) ........................ 10-2023-0070421

(51) Int. Cl.
*H10K 59/124* (2023.01)
*H10K 59/121* (2023.01)
(Continued)

(52) U.S. Cl.
CPC ....... *H10K 59/124* (2023.02); *H10K 59/1213* (2023.02); *H10K 59/131* (2023.02); *H10K 59/65* (2023.02); *H10K 59/873* (2023.02)

(58) Field of Classification Search
None
See application file for complete search history.

(56) References Cited

U.S. PATENT DOCUMENTS 11,049,927 B2 * 6/2021 Kim ....................... G01N 27/20
2020/0105844 A1 4/2020 Wang et al.
(Continued)

FOREIGN PATENT DOCUMENTS

CN 111258456 A 6/2020
CN 213782041 U 7/2021
KR 10-2020-0145954 A 12/2020

*Primary Examiner* — Nishath Yasmeen
(74) *Attorney, Agent, or Firm* — Womble Bond Dickinson (US) LLP

(57) ABSTRACT

A display panel includes a substrate, first and second sub-pixel circuits on the substrate and spaced from each other with a transmissive area therebetween, first and second sub-pixel electrodes respectively electrically connected to the first and second sub-pixel circuits, a counter electrode overlapping the first and second sub-pixel electrodes, a common layer including an organic material, and interposed between the first sub-pixel electrode and the counter electrode and between the second sub-pixel electrode and the counter electrode, and a plurality of inorganic insulating layers interposed between the substrate and the first sub-pixel electrode and between the substrate and the second sub-pixel electrode, wherein at least one inorganic insulating layer from the plurality of inorganic insulating layers includes an opening corresponding to the transmissive area, wherein the display panel further includes an overhang structure including a tip extending toward the opening of the at least one inorganic insulating layer.

26 Claims, 19 Drawing Sheets

(51) Int. Cl.

| | |
|---|---|
| ***H10K 59/131*** | (2023.01) |
| ***H10K 59/65*** | (2023.01) |
| ***H10K 59/80*** | (2023.01) |

(56) References Cited

U.S. PATENT DOCUMENTS

| | | | | |
|---|---|---|---|---|
| 2021/0066440 | A1 | 3/2021 | Okabe et al. | |
| 2021/0175477 | A1 | 6/2021 | Lim et al. | |
| 2021/0210718 | A1* | 7/2021 | Zhang ................ | H10K 59/1201 |
| 2021/0343813 | A1 | 11/2021 | Lee et al. | |
| 2022/0005900 | A1 | 1/2022 | You et al. | |
| 2022/0085328 | A1 | 3/2022 | Kang et al. | |
| 2022/0209187 | A1 | 6/2022 | Bok et al. | |
| 2022/0216287 | A1 | 7/2022 | You | |
| 2022/0328790 | A1 | 10/2022 | Seon et al. | |
| 2022/0344621 | A1 | 10/2022 | Lee et al. | |
| 2023/0033385 | A1 | 2/2023 | Park et al. | |
| 2023/0232653 | A1* | 7/2023 | Lee ...................... | H10K 50/844 257/40 |

* cited by examiner

DISPLAY PANEL AND ELECTRONIC APPARATUS INCLUDING THE SAME

CROSS-REFERENCE TO RELATED APPLICATION

The present application claims priority to and the benefit of Korean Patent Application No. 10-2023-0062700, filed on May 15, 2023, and Korean Patent Application No. 10-2023-0070421, filed on May 31, 2023, in the Korean Intellectual Property Office, the entire contents of both of which are incorporated by reference herein.

BACKGROUND

1. Field

One or more embodiments relate to a display panel including a plurality of transmissive areas and an electronic apparatus including the display panel.

2. Description of Related Art

Recently, display panels have been used for various purposes. Also, as thicknesses and weights of display panels have decreased, the range of applications of display panels has increased.

As the area occupied by display areas in display panels increases, various functions linked to or associated with the display panels are being added. Research on various types of display panels has been conducted to add various functions to display panels and electronic apparatuses including display panels while increasing the area occupied by display areas.

SUMMARY

One or more embodiments of the present disclosure include a display panel having a structure in which various types of components may be located in a transmissive area located in a display area, and an electronic apparatus including the display panel. However, embodiments of the present disclosure are examples, and do not limit the scope of the present disclosure.

Additional aspects of the present disclosure will be set forth in part in the description which follows and, in part, will be apparent from the description, or may be learned by practice of the presented embodiments.

According to one or more embodiments, a display panel includes a substrate, a first sub-pixel circuit and a second sub-pixel circuit located on the substrate and spaced from each other with a transmissive area therebetween, a first sub-pixel electrode electrically connected to the first sub-pixel circuit, a second sub-pixel electrode electrically connected to the second sub-pixel circuit and spaced from the first sub-pixel electrode with the transmissive area therebetween, a counter electrode overlapping the first sub-pixel electrode and the second sub-pixel electrode, a common layer including an organic material, and interposed between the first sub-pixel electrode and the counter electrode and between the second sub-pixel electrode and the counter electrode, and a plurality of inorganic insulating layers interposed between the substrate and the first sub-pixel electrode and between the substrate and the second sub-pixel electrode, wherein at least one inorganic insulating layer from among the plurality of inorganic insulating layers includes an opening corresponding to the transmissive area, and wherein the display panel further includes an overhang structure including a tip extending toward the opening of the at least one inorganic insulating layer.

The overhang structure may include a first conductive layer including a first portion located on a top surface of the at least one inorganic insulating layer and a second portion extending toward the opening of the at least one inorganic insulating layer, and a second conductive layer located on the first conductive layer and including the tip protruding toward the opening of the at least one inorganic insulating layer, wherein the first conductive layer and the second conductive layer are each located on opposite sides of the opening of the at least one inorganic insulating layer.

The common layer may include a first portion overlapping the opening of the at least one inorganic insulating layer, and a second portion located on the tip of the second conductive layer and separated from the first portion of the common layer.

The counter electrode may include a first portion overlapping the opening of the at least one inorganic insulating layer, and a second portion located on the tip of the second conductive layer and separated from the first portion of the counter electrode.

The counter electrode may include an opening overlapping the opening of the at least one inorganic insulating layer.

The display panel may further include a lithium fluoride (LiF) layer or a capping layer located on the counter electrode, wherein the LiF layer or the capping layer includes a first portion overlapping the opening of the at least one inorganic insulating layer, and a second portion located on the tip of the second conductive layer and separated from the first portion of the LiF layer or the capping layer.

The display panel may further include a first inorganic encapsulation layer on the counter electrode, an organic encapsulation layer on the first inorganic encapsulation layer, and a second inorganic encapsulation layer on the organic encapsulation layer, wherein the first inorganic encapsulation layer continuously extends to overlap the tip of the second conductive layer, a part of the first conductive layer on a side surface of the at least one inorganic insulating layer facing the opening of the at least one inorganic insulating layer, and the opening of the at least one inorganic insulating layer.

The display panel may further include an organic insulating layer interposed between the plurality of inorganic insulating layers and the first sub-pixel electrode and between the plurality of inorganic insulating layers and the second sub-pixel electrode.

The organic insulating layer may include an opening overlapping the opening of the at least one inorganic insulating layer.

The display panel may further include a data line electrically connected to the first sub-pixel circuit and the second sub-pixel circuit, wherein the data line includes a first portion on the plurality of inorganic insulating layers, and a connecting portion overlapping the opening of the at least one inorganic insulating layer, located under the opening, and electrically connected to the first portion.

According to one or more embodiments, an electronic apparatus includes a display panel including a first component area and a display area around the first component area, and a first component located under the display panel and overlapping the first component area, wherein the display panel includes a substrate, a first sub-pixel circuit and a second sub-pixel circuit located on the substrate to correspond to the first component area and spaced from each other with a transmissive area therebetween, a first sub-pixel electrode electrically connected to the first sub-pixel circuit, a second sub-pixel electrode electrically connected to the second sub-pixel circuit and spaced from the first sub-pixel electrode with the transmissive area therebetween, a counter electrode overlapping the first sub-pixel electrode and the second sub-pixel electrode, a common layer including an organic material, and interposed between the first sub-pixel electrode and the counter electrode and between the second sub-pixel electrode and the counter electrode, a plurality of inorganic insulating layers interposed between the substrate and the first sub-pixel electrode and between the substrate and the second sub-pixel electrode, at least one inorganic insulating layer from among the plurality of inorganic insulating layers including an opening corresponding to the transmissive area, an organic insulating layer interposed between the plurality of inorganic insulating layers and the first sub-pixel electrode and between the plurality of inorganic insulating layers and the second sub-pixel electrode, a first conductive layer including a first portion located on a top surface of the at least one inorganic insulating layer and a second portion extending toward the opening of the at least one inorganic insulating layer, and a second conductive layer located on the first conductive layer and including a tip protruding toward the opening of the at least one inorganic insulating layer, wherein the first conductive layer and the second conductive layer are each located on opposite sides of the opening of the at least one inorganic insulating layer.

The organic insulating layer may be on the second conductive layer and includes an opening overlapping the opening of the at least one inorganic insulating layer.

The common layer may include a first portion overlapping the opening of the at least one inorganic insulating layer, and a second portion located on the tip of the second conductive layer and separated from the first portion of the common layer.

The counter electrode may include a first portion overlapping the opening of the at least one inorganic insulating layer, and a second portion located on the tip of the second conductive layer and separated from the first portion of the counter electrode.

The counter electrode may include an opening overlapping the opening of the at least one inorganic insulating layer.

The display panel may further include an anti-deposition layer located on the common layer and overlapping the opening of the counter electrode.

The display panel may further include a lithium fluoride (LiF) layer or a capping layer located on the counter electrode, wherein the LiF layer or the capping layer includes a first portion overlapping the opening of the at least one inorganic insulating layer, and a second portion on the tip of the second conductive layer and separated from the first portion of the LiF layer or the capping layer.

The display panel may further include a first inorganic encapsulation layer located on the counter electrode, an organic encapsulation layer on the first inorganic encapsulation layer, and a second inorganic encapsulation layer on the organic encapsulation layer, wherein the first inorganic encapsulation layer continuously extends to overlap the tip of the second conductive layer, a part of the first conductive layer located on a side surface of the at least one inorganic insulating layer facing the opening of the at least one inorganic insulating layer, and the opening of the at least one inorganic insulating layer.

The electronic apparatus may further include an etch stopper layer on a bottom surface of the opening.

Each of the first sub-pixel circuit and the second sub-pixel circuit may include a silicon-based transistor including a silicon-based semiconductor layer, and an oxide-based transistor including an oxide-based semiconductor layer, wherein the etch stopper layer includes a same material as the silicon-based semiconductor layer or the oxide-based semiconductor layer.

The display panel may further include a data line electrically connected to each of the first sub-pixel circuit and the second sub-pixel circuit, wherein the data line includes a first portion electrically connected to the first sub-pixel circuit, a second portion electrically connected to the second sub-pixel circuit, and a third portion electrically connected to each of the first portion and the second portion of the data line, wherein the third portion overlaps the opening of the at least one inorganic insulating layer.

The first component may include a sensor or a camera.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1A:
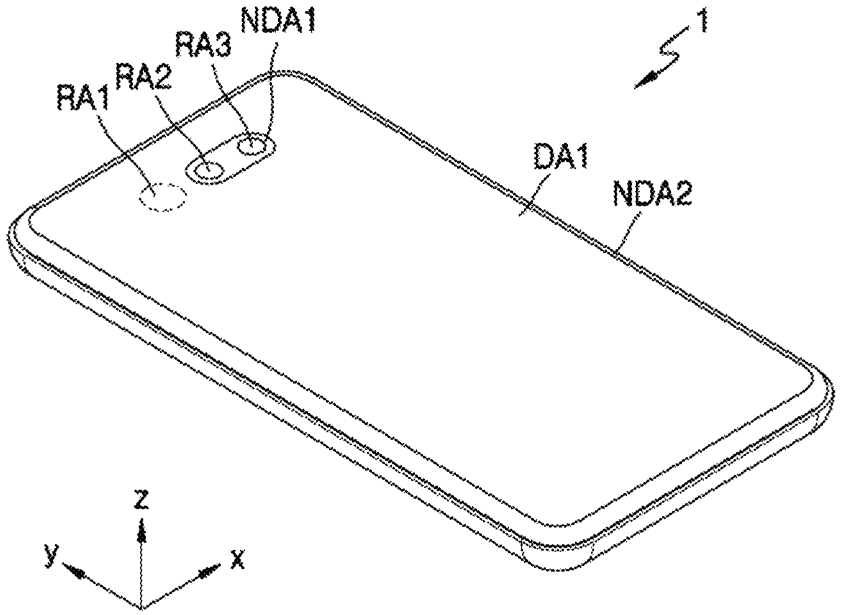
FIG. 1A is a perspective view schematically illustrating an electronic apparatus, according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure.

As the present disclosure allows for various changes and numerous embodiments, certain embodiments will be illustrated in the drawings and described in the detailed description. Effects, aspects, and features of embodiments of the present disclosure, and methods for achieving them will be clarified with reference to embodiments described below in detail with reference to the drawings. However, the present disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or reduced for convenience of explanation. For example, because sizes and thicknesses of elements in the drawings are arbitrarily illustrated for convenience of explanation, the present disclosure is not limited thereto.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. Also, "at least one of A and B" or "at least one of A or B" is used herein to select only A, select only B, or select both A and B.

It will be understood that when a layer, an area, or an element is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or a component is referred to as being "electrically connected," it may be directly electrically connected, and/or may be indirectly electrically connected with intervening layers, regions, or components therebetween.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
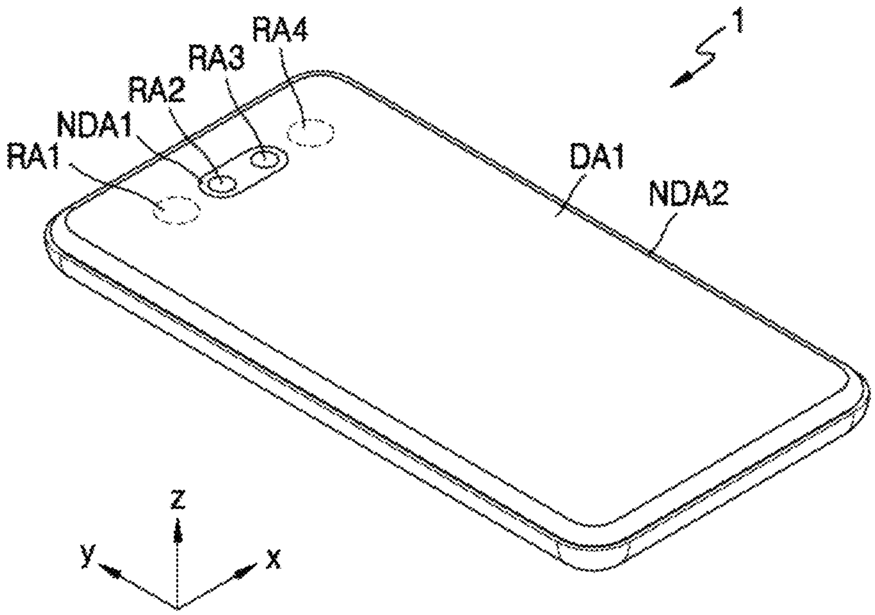
FIG. 1B is a perspective view schematically illustrating an electronic apparatus, according to one or more embodiments.

FIGS. 1A and 1B are perspective views schematically illustrating an electronic apparatus, according to one or more embodiments.

Referring to FIG. 1A, an electronic apparatus 1 may include a first area RA1 and a first display area DA1 for providing an image. In a plan view, the first area RA1 may be surrounded by the first display area DA1. Sub-pixels may be located in the first area RA1 and the first display area DA1. Accordingly, the first area RA1 and the first display area DA1 may provide a certain image by using light emitted from the sub-pixels. Because the first area RA1 may provide an image through the sub-pixels, the first area RA1 may be referred to as a second display area. The first area RA1 may have an area less than the area of the first display area DA1. Unlike the first display area DA1, the first area RA1 may further include a light-transmitting area through which light may pass.

In one or more embodiments, the electronic apparatus 1 may further include a second area RA2 and a third area RA3 spaced from the first area RA1 and surrounded by the first display area DA1. A first non-display area NDA1 may be located between the second area RA2 and the first display area DA1 and between the third area RA3 and the first display area DA1. The first non-display area NDA1 may be around (e.g., may surround) the second area RA2 and the third area RA3. The first non-display area NDA1 may be surrounded by the first display area DA1. The first non-display area NDA1 may correspond to a dead area where sub-pixels are not located.

The electronic apparatus 1 may include a second non-display area NDA2 located outside the first display area DA1. The second non-display area NDA2 is a dead area that is located outside the first display area DA1 and does not display an image, and the second non-display area NDA2 may entirely surround the first display area DA1. A driver or the like for providing an electrical signal or power to the first display area DA1 may be located in the second non-display area NDA2. A pad to which an electronic element or a printed circuit board may be electrically connected may be located in the second non-display area NDA2.

Although the electronic apparatus 1 is a smartphone for convenience of explanation, the electronic apparatus 1 of the present disclosure is not limited thereto. The electronic apparatus 1 may be applied to any of various products such as a television, a laptop computer, a monitor, an advertisement board, or an Internet of things (IoT) product as well as a portable electronic apparatus such as a mobile phone, a smartphone, a tablet personal computer (PC), a mobile communication terminal, an electronic organizer, an electronic book, a portable multimedia player (PMP), a navigation device, or an ultra-mobile PC (UMPC). Also, the electronic apparatus 1 according to one or more embodiments may be applied to a wearable device such as a smart watch, a watch phone, a glasses-type display, or a head-mounted display (HMD). Also, the electronic apparatus 1 according to one or more embodiments may be applied to a center information display (CID) located on an instrument panel, a center fascia, or a dashboard of a vehicle, a room mirror display replacing a side-view mirror of a vehicle, or a display screen located on the back of a front seat for entertainment for a person in a back seat of a vehicle.

Although each of the first area RA1, the second area RA2, and the third area RA3 has a substantially circular shape in FIG. 1A, the present disclosure is not limited thereto. In one or more embodiments, each of the first area RA1, the second area RA2, and the third area RA3 may have any of various shapes such as an elliptical shape or a polygonal shape.

Although the first area RA1, the second area RA2, and the third area RA3 are located on an upper portion of the first display area DA1 having a substantially quadrangular shape (in a +y direction) in FIG. 1A when viewed in a direction (e.g., a z direction) substantially perpendicular to a top surface of the electronic apparatus 1, the present disclosure is not limited thereto. In one or more embodiments, the first area RA1, the second area RA2, and the third area RA3 may be located on a lower portion or at the center of the first display area DA1.

Each of the first area RA1, the second area RA2, and the third area RA3 may include a transmissive area through which light or sound may be transmitted. In one or more embodiments, a transmittance of each of the second area RA2 and the third area RA3 may be greater than a transmittance of the first area RA1.

Although the first area RA1 is located on a side of the second area RA2 and the third area RA3 surrounded by the first non-display area NDA1 in FIG. 1A, the present disclosure is not limited thereto. In one or more embodiments, as shown in FIG. 1B, the first area RA1 and a fourth area RA4 may be located on opposite sides of the second area RA2 and the third area RA3 surrounded by the first non-display area NDA1. In one or more embodiments, the first area RA1 and the fourth area RA4 may be located at various positions. For example, the first area RA1 and the fourth area RA4 may be located on a side (e.g., the same side) of the first non-display area NDA1. For example, the first area RA1 and the fourth area RA4 located on a side of the first non-display area NDA1 may be located adjacent to each other. In one or more embodiments, any one of the first area RA1 and the fourth area RA4 may correspond to a light emitter of a sensor that recognizes a user's body part, and the other may correspond to a light receiver of the sensor.

Although the second area RA2 and the third area RA3 are surrounded by the first non-display area NDA1 in FIG. 1B, the present disclosure is not limited thereto. For example, any one of the second area RA2 and the third area RA3 may be omitted, and the other one may be surrounded by the first non-display area NDA1. In this case, the first area RA1 and the fourth area RA4 may be spaced from each other with the first non-display area NDA1 therebetween, or may be located adjacent to each other on a side (e.g., a left side or a right side) of the first non-display area NDA1.

Figure 2A:
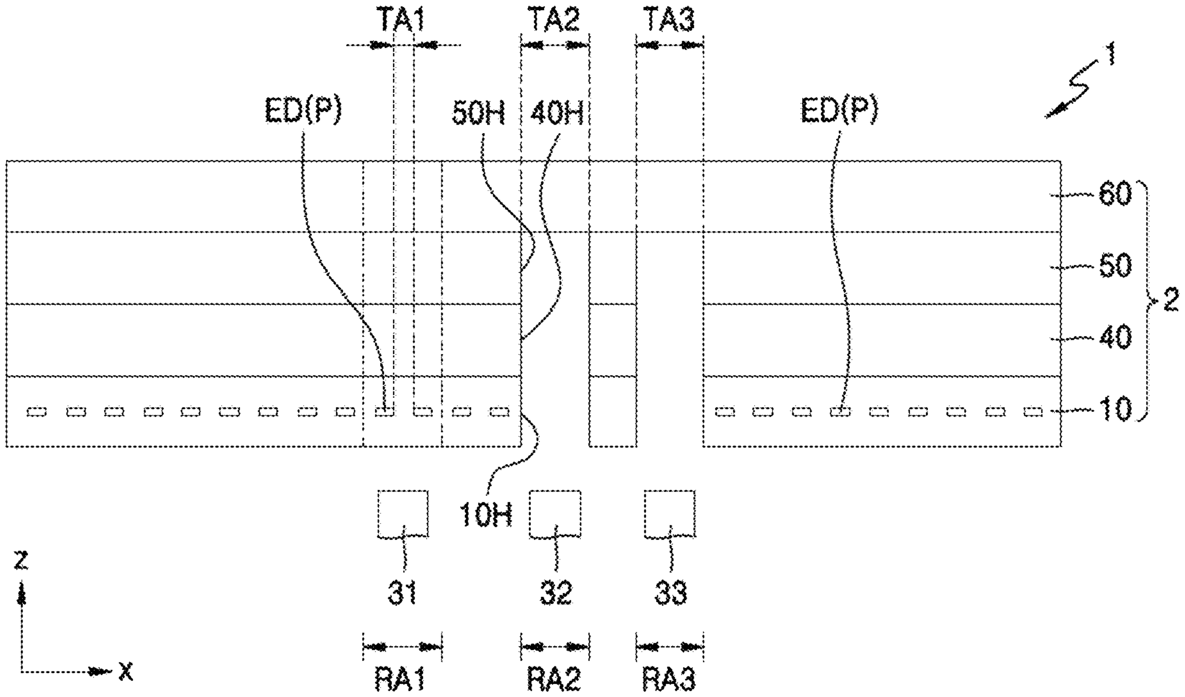
FIG. 2A is a cross-sectional view schematically illustrating an electronic apparatus, according to one or more embodiments.

FIG. 2A is a cross-sectional view schematically illustrating an electronic apparatus, according to one or more embodiments.

Referring to FIG. 2A, the electronic apparatus 1 may include a display panel 2, and a component, for example, first to third components 31, 32, and 33, located under the display panel 2. The display panel 2 may include a display layer 10, an input sensing layer 40 located on a top surface of the display layer 10, an optical functional layer 50 on the input sensing layer 40, and a cover window 60.

The display layer 10 may display an image by using light-emitting diodes ED. The light-emitting diodes ED may include organic light-emitting diodes including an organic material. Alternatively, the light-emitting diodes ED may include inorganic light-emitting diodes or quantum dot light-emitting diodes. An area where light is emitted from each light-emitting diode ED may correspond to a sub-pixel P.

The input sensing layer 40 obtains coordinate information according to an external input, for example, a touch event. The input sensing layer 40 may include a sensing electrode (or a touch electrode) and trace lines connected to the sensing electrode. The input sensing layer 40 may be located on the display layer 10. The input sensing layer 40 may detect an external input by using a mutual capacitance method and/or a self-capacitance method.

The input sensing layer 40 may be directly formed on the display layer 10, or may be separately formed and then may be coupled through an adhesive layer such as an optically clear adhesive (OCA). For example, the input sensing layer 40 may be continuously formed after the display layer 10 is formed, and in this case, an adhesive layer may not be located between the input sensing layer 40 and the display layer 10.

The optical functional layer 50 may include an anti-reflection layer. The anti-reflection layer may reduce a reflectance of light (e.g., a reflectance of external light) incident on the display layer 10 through the cover window 60. The anti-reflection layer may include a phase retarder and a polarizer.

In one or more embodiments, the anti-reflection layer may include a black matrix and color filters. The color filters may be arranged in consideration of a color of light emitted from each of the sub-pixels of the display layer 10. In one or more embodiments, the anti-reflection layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

The optical functional layer 50 may include a lens layer. The lens layer may improve light emission efficiency or reduce color deviation of light emitted from the display layer 10. The lens layer may include a layer having a concave or convex lens shape, and/or may include a plurality of layers having different refractive indices. The optical functional layer 50 may include both the anti-reflection layer and the lens layer, or may include any one of the anti-reflection layer and the lens layer.

The cover window 60 may protect a front surface (e.g., a top surface) of the display panel 2 and/or the electronic apparatus 1. The cover window 60 may include a resin such as polyimide. Alternatively, the cover window 60 may include a glass substrate such as ultra-thin glass (UTG).

Each of the first area RA1, the second area RA2, and the third area RA3 may include a transmissive area. In one or more embodiments, the first area RA1 may include a first transmissive area TA1 between neighboring sub-pixels P, for example, between neighboring light-emitting diodes ED. The second area RA2 may include a second transmissive area TA2 having substantially the same area and shape (e.g., a planar shape) as the second area RA2. The third area RA3 may include a third transmissive area TA3 having substantially the same area and shape (e.g., a planar shape) as the third area RA3.

The first component 31 may overlap the first area RA1, the second component 32 may overlap the second area RA2, and the third component 33 may overlap the third area RA3.

Each of the first component 31, the second component 32, and the third component 33 may be an electronic element using light or sound. The electronic element may include a sensor that measures a distance such as a proximity sensor, a sensor that recognizes a user's body part (e.g., fingerprint, iris, and/or face), a small lamp that outputs light, or an image sensor (e.g., a camera) that captures an image or a video. The electronic element using light may use light of any of various wavelength bands such as visible light, infrared light, or ultraviolet light. The electronic element using sound may use ultrasound or sound of another frequency band. Light emitted from the electronic element or external light may pass through the first transmissive area TA1, the second transmissive area TA2, and the third transmissive area TA3.

In one or more embodiments, the first component 31 may be a sensor for recognizing the user's body part by using light and may be a light receiver that receives light, and the second component 32 may be a sensor for recognizing the user's body part by using light and may be a light emitter that emits light. In one or more embodiments, light emitted from the second component 32 may be reflected by the user's body part and received by the first component 31. The third component 33 may include a camera.

The display layer 10, the input sensing layer 40, and/or the optical functional layer 50 may include an opening corresponding to each of the second transmissive area TA2 and the third transmissive area TA3. In one or more embodiments, in FIG. 2A, the display layer 10, the input sensing layer 40, and the optical functional layer 50 located in each of the second transmissive area TA2 and the third transmissive area TA3 respectively include openings 10H, 40H, and 50H. Accordingly, a transmittance of each of the second area RA2 and the third area RA3 may be greater than a transmittance of the first area RA1. In one or more embodiments, a light transmittance of the first transmissive area TA1 may be about 15% or more, for example, about 20% or more. A light transmittance of each of the second transmissive area TA2 and the third transmissive area TA3 may be 30% or more, 40% or more, 50% or more, 85% or more, or 90% or more.

Figure 2B:
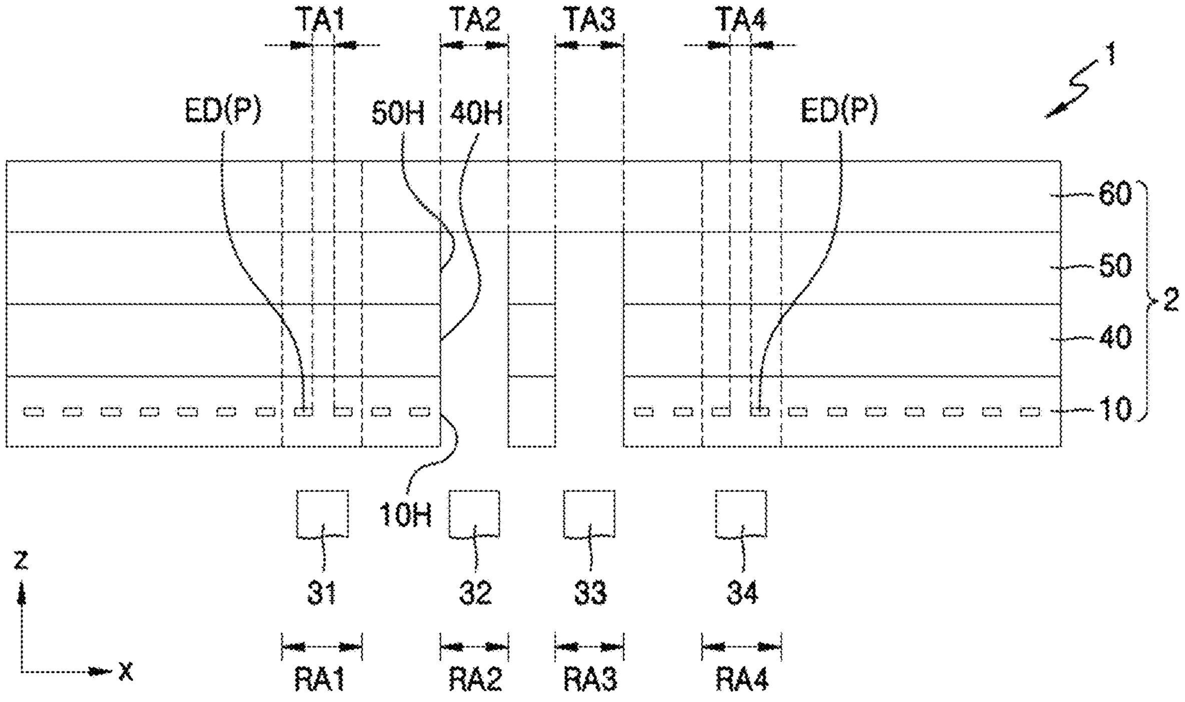
FIG. 2B is a cross-sectional view schematically illustrating an electronic apparatus, according to one or more embodiments.

Referring to FIG. 2B, the electronic apparatus 1 may include the display panel 2, and first to fourth components 31, 32, 33, and 34 located under the display panel 2. The first to fourth components 31, 32, 33, and 34 may respectively overlap the first area RA1, the second area RA2, the third area RA3, and the fourth area RA4.

Each of the first area RA1, the second area RA2, the third area RA3, and the fourth area RA4 may include a transmissive area. In one or more embodiments, the first area RA1 may include the first transmissive area TA1 between neighboring sub-pixels P, for example, between neighboring light-emitting diodes ED. The second area RA2 may include the second transmissive area TA2 having substantially the same area and shape (e.g., a planar shape) as the second area RA2. The third area RA3 may include the third transmissive area TA3 having substantially the same area and shape (e.g., a planar shape) as the third area RA3. The fourth area RA4 may include a fourth transmissive area TA4 between neighboring sub-pixels P, for example, between neighboring light-emitting diodes ED. The display layer 10, the input sensing layer 40, and/or the optical functional layer 50 may include the openings 10H, 40H, and 50H corresponding to each of the second transmissive area TA2 and the third transmissive area TA3, respectively.

Each of the first component 31, the second component 32, the third component 33, and the fourth component 34 may be an electronic element using light or sound. The electronic element may include a sensor that measures a distance such as a proximity sensor, a sensor that recognizes the user's body part (e.g., fingerprint, iris, or face), a small lamp that outputs light, or an image sensor (e.g., a camera) that captures an image or a video. The electronic element using light may use light of any of various wavelength bands such as visible light, infrared light, or ultraviolet light. The electronic element using sound may use ultrasound or sound of another frequency band. Light emitted from the electronic element or external light may pass through the first component 31, the second component 32, the third component 33, and the fourth component 34.

Although the first area RA1 and the fourth area RA4 are located on different sides of the first non-display area NDA1 in FIGS. 1B and 2B, the present disclosure is not limited thereto. In one or more embodiments, the first area RA1 and the fourth area RA4 may be located on the same side of the first non-display area NDA1 to be adjacent to each other.

In one or more embodiments, the first component 31 may be a sensor for recognizing the user's body part by using light and may be a light receiver that receives light, and the fourth component 34 may be a sensor for recognizing the user's body part by using light and may be a light emitter that emits light. In one or more embodiments, light emitted from the fourth component 34 may be reflected by the user's body part and received by the first component 31.

The second component 32 and the third component 33 may respectively include a sensor and a camera that are different from the first and fourth components 31 and 34.

A structure of the first component 31 and a structure of the display panel 2 corresponding to the fourth component 34 are substantially the same. Although the following is described based on FIGS. 1A and 2A for convenience of explanation, a structure of the first area RA1 in the display panel 2 described below is substantially the same as a structure of the fourth area RA4.

Figure 3:
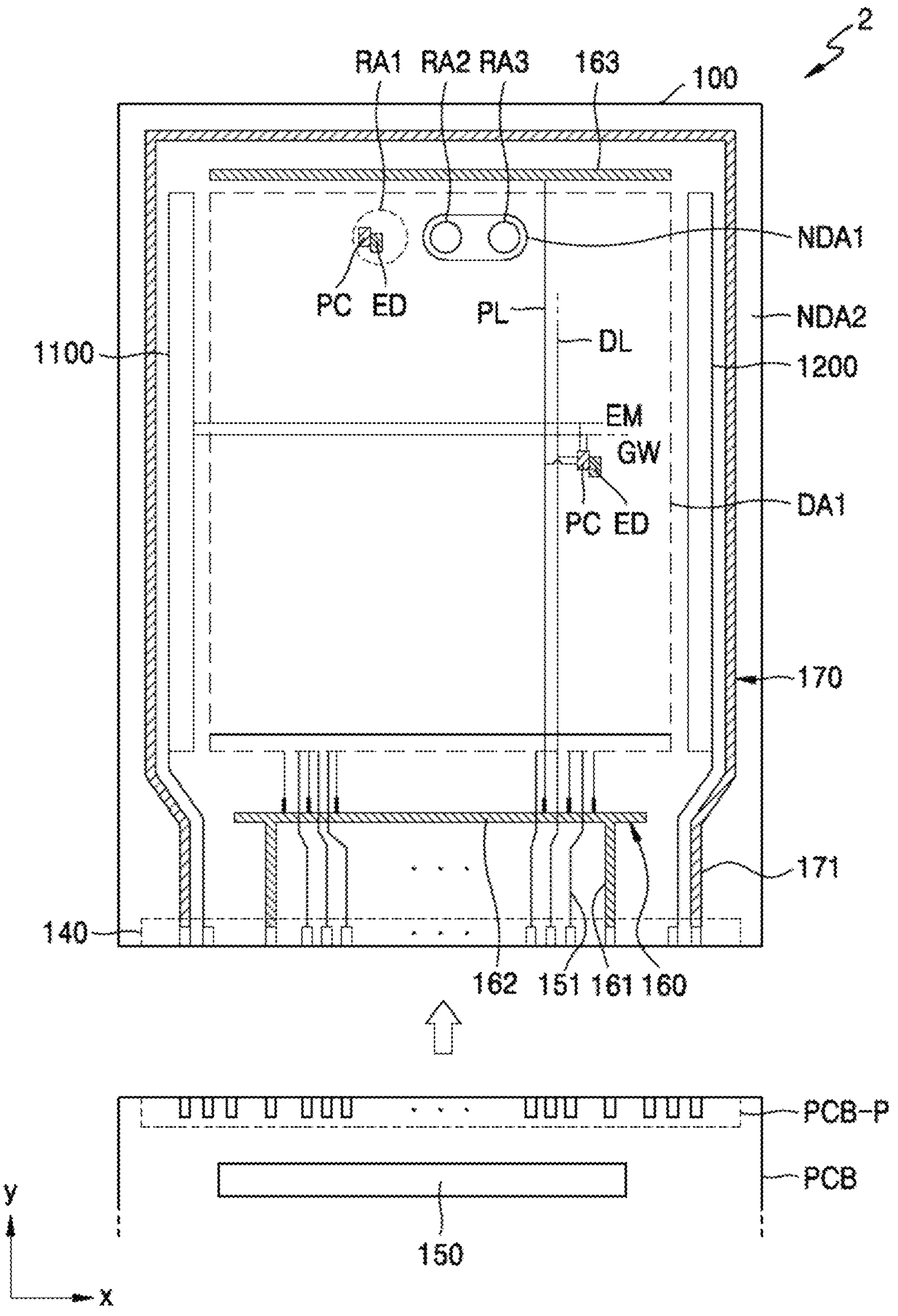
FIG. 3 is a plan view schematically illustrating a display panel, according to one or more embodiments.

FIG. 3 is a plan view schematically illustrating a display panel, according to one or more embodiments.

Referring to FIG. 3, the display panel 2 may include the first area RA1, the second area RA2, the third area RA3, the first non-display area NDA1 around (e.g., surrounding) the second area RA2 and the third area RA3, and the second non-display area NDA2.

FIG. 3 may illustrate a substrate 100 of the display panel 2. For example, when the display panel 2 includes the first area RA1, the second area RA2, the third area RA3, the first non-display area NDA1, and the second non-display area NDA2, it may mean that the substrate 100 includes the first area RA1, the second area RA2, the third area RA3, the first non-display area NDA1, and the second non-display area NDA2.

The display panel 2 may include the light-emitting diodes ED located in the first display area DA1 and the first area RA1 and sub-pixel circuits PC electrically connected to the light-emitting diodes ED.

In the non-display area (e.g., the second non-display area NDA2), a first outer driving circuit 1100, a second outer driving circuit 1200, a terminal 140, a data driving circuit 150, a first power supply line 160, and a second power supply line 170 may be located.

The first outer driving circuit 1100 may include a scan and control driving circuit. The first outer driving circuit 1100 may provide a scan signal and an emission control signal to each sub-pixel circuit PC through a scan line GW and an emission control line EM (e.g., see FIG. 4). The second outer driving circuit 1200 may also include a scan and control driving circuit. The second outer driving circuit 1200 may be located parallel to the first outer driving circuit 1100 with the first display area DA1 therebetween. Like the first outer driving circuit 1100, the second outer driving circuit 1200 may respectively provide a scan signal and an emission control signal to each sub-pixel circuit PC through the scan line GW and the emission control line EM.

The terminal 140 may be located on a side of the second non-display area NDA2. The terminal 140 may be exposed without being covered by an insulating layer, and may be electrically connected to a printed circuit board PCB. A terminal PCB-P of the printed circuit board PCB may be electrically connected to the terminal 140 of the display panel 2. The printed circuit board PCB transmits a signal or power of a controller to the display panel 2. A control signal generated by the controller may be transmitted to the first and second outer driving circuits 1100 and 1200 through the printed circuit board PCB. The controller may respectively provide a first power supply voltage (or a driving voltage) ELVDD (see FIG. 4) and a second power supply voltage (or a common voltage) ELVSS (see FIG. 4) to the first and second power supply lines 160 and 170 through first and second connection wirings 161 and 171. The first power supply voltage ELVDD of the first power supply line 160 may be provided to a driving voltage line PL, and the second power supply voltage ELVSS of the second power supply line 170 may be provided to an electrode (e.g., a cathode) of a light-emitting diode ED of each sub-pixel P.

The data driving circuit 150 is electrically connected to a data line DL. A data signal of the data driving circuit 150 may be applied to each sub-pixel P through a connection wiring 151 connected to the terminal 140 and the data line DL connected to the connection wiring 151. Although the data driving circuit 150 is located on the printed circuit board PCB in FIG. 3, in one or more embodiments, the data driving circuit 150 may be located on the substrate 100. For example, the data driving circuit 150 may be located between the terminal 140 and the first power supply line 160.

The first power supply line 160 may include a first sub-line 162 and a second sub-line 163 extending parallel to each other in a first direction (e.g., an x direction) with the first display area DA1 therebetween. The second power supply line 170 may have a loop shape with one side open and may partially surround the first display area DA1.

Figure 4:
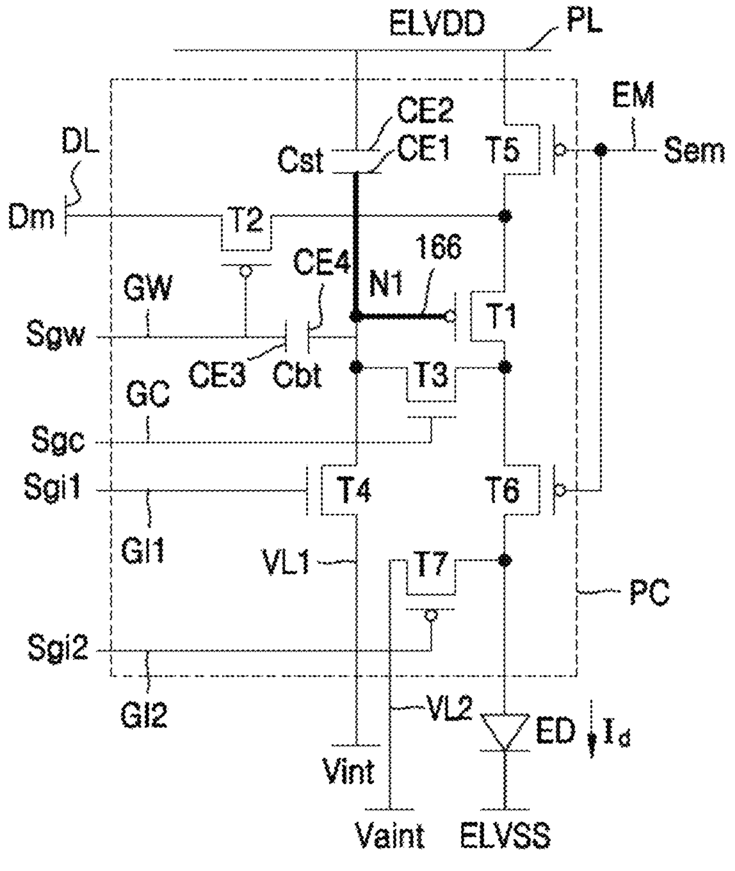
FIG. 4 is an equivalent circuit diagram schematically illustrating a light-emitting diode and a sub-pixel circuit provided in a display panel, according to one or more embodiments.

FIG. 4 is an equivalent circuit diagram schematically illustrating a light-emitting diode and a sub-pixel circuit provided in a display panel, according to one or more embodiments. The light-emitting diode ED and the sub-pixel circuit PC described with reference to FIG. 4 may be located in each of the first area RA1 and the first display area DA1 described with reference to FIG. 3.

Referring to FIG. 4, the light-emitting diode ED may be electrically connected to the sub-pixel circuit PC. The sub-pixel circuit PC may include first to seventh transistors T1, T2, T3, T4, T5, T6, and T7, a storage capacitor Cst, and a boost capacitor Cbt. In one or more embodiments, the sub-pixel circuit PC may not include the boost capacitor Cbt.

Some of the first to seventh transistors T1, T2, T3, T4, T5, T6, and T7 may be n-channel MOSFETs (NMOSs) and the rest may be provided as p-channel MOSFETs (PMOSs). In one or more embodiments, as shown in FIG. 4, the third and fourth transistors T3 and T4 may be NMOSs, and the rest may be PMOSs. For example, the third and fourth transistors T3 and T4 may be oxide-based transistors including an oxide-based semiconductor material, and the rest may be silicon-based transistors including a silicon-based semiconductor material. In one or more embodiments, the third, fourth, and seventh transistors T3, T4, and T7 may be oxide-based transistors, and the rest may be silicon-based transistors.

The first to seventh transistors T1, T2, T3, T4, T5, T6, and T7, the storage capacitor Cst, and the boost capacitor Cbt may be connected to signal lines. The signal lines may include the scan line GW, the emission control line EM, a compensation gate line GC, a first initialization gate line GI1, a second initialization gate line GI2, and the data line DL. The sub-pixel circuit PC may be electrically connected to a voltage line, for example, the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL via the fifth transistor T5, and a second electrode of the first transistor T1 may be electrically connected to a first electrode (e.g., a sub-pixel electrode, or an anode) of the light-emitting diode ED via the sixth transistor T6. One of the first electrode and the second electrode of the first transistor T1 may be a source electrode and the other may be a drain electrode. The first transistor T1 may supply driving current $I_d$ to the light-emitting diode ED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL via the fifth transistor T5. One of the first electrode and the second electrode of the second transistor T2 may be a source electrode and the other may be a drain electrode. The second transistor T2 may be turned on according to a scan signal Sgw received through the scan line GW and may perform a switching operation of transmitting a data signal Dm received through the data line DL to the first electrode of the first transistor T1.

The third transistor T3 may be a compensation transistor for compensating for a threshold voltage of the first transistor T1. A third gate electrode of the third transistor T3 is connected to the compensation gate line GC. A first electrode of the third transistor T3 is connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 is connected to the second electrode of the first transistor T1 and is electrically connected to a sub-pixel electrode (e.g., anode) of the light-emitting diode ED via the sixth transistor T6. One of the first electrode and the second electrode of the third transistor T3 may be a source electrode and the other may be a drain electrode.

The third transistor T3 is turned on according to a compensation signal Sgc received through the compensation gate line GC to diode-connect the first transistor T1 by electrically connecting the first gate electrode of the first transistor T1 and the second electrode (e.g., drain electrode) of the first transistor T1.

The fourth transistor T4 may be a first initialization transistor for initializing the first gate electrode of the first transistor T1. A fourth gate electrode of the fourth transistor T4 is connected to the first initialization gate line GI1. A first electrode of the fourth transistor T4 is connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode and the other may be a drain electrode. The fourth transistor T4 may be turned on according to a first initialization signal Sgi1 received through the first initialization gate line GI1 and may perform an initialization operation of initializing a voltage of the first gate electrode of the first transistor T1 by transmitting a first initialization voltage Vint to the first gate electrode of the first transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is connected to a second electrode of the seventh transistor T7 and the sub-pixel electrode (e.g., the anode) of the light-emitting diode ED. One of the first electrode and the second electrode of the sixth transistor T6 may be a source electrode and the other may be a drain electrode.

The fifth transistor T5 and the sixth transistor T6 may be concurrently (e.g., simultaneously) turned on according to an emission control signal Sem received through the emission control line EM so that the driving voltage ELVDD is transmitted to the light-emitting diode ED and the driving current $I_d$ flows through the light-emitting diode ED.

The seventh transistor T7 may be a second initialization transistor for initializing the first electrode (e.g., the anode) of the light-emitting diode ED. A seventh gate electrode of the seventh transistor T7 is connected to the second initialization gate line GI2. A first electrode of the seventh transistor T7 is connected to the second initialization voltage line VL2. The second electrode of the seventh transistor T7 is connected to the second electrode of the sixth transistor T6 and the sub-pixel electrode (e.g., the anode) of the light-emitting diode ED. The seventh transistor T7 may be turned on according to a second initialization signal Sgi2 received through the second initialization gate line GI2 so that a second initialization voltage Vaint is transmitted to the sub-pixel electrode (e.g., the anode) of the light-emitting diode ED and the first electrode of the light-emitting diode ED is initialized.

In one or more embodiments, the second initialization voltage line VL2 may be a next scan line. For example, the second initialization gate line GI2 connected to the seventh transistor T7 of the sub-pixel circuit PC located in an $n^{th}$ row (n is a natural number) may correspond to a scan line of the sub-pixel circuit PC located in an $(n+1)^{th}$ row. In one or more embodiments, the second initialization voltage line VL2 may be the emission control line EM. For example, the emission control line EM may be electrically connected to the fifth to seventh transistor T5, T6, and T7.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store a charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may increase a voltage of a first node N1 when the scan signal Sgw supplied through the scan line GW is turned off, and may clearly express a black grayscale when a voltage of the first node N1 increases.

The first node N1 may be an area to which the first gate electrode of the first transistor T1, the first electrode of the third transistor T3, the second electrode of the fourth transistor T4, and the fourth electrode CE4 of the boost capacitor Cbt are connected.

Figure 5:
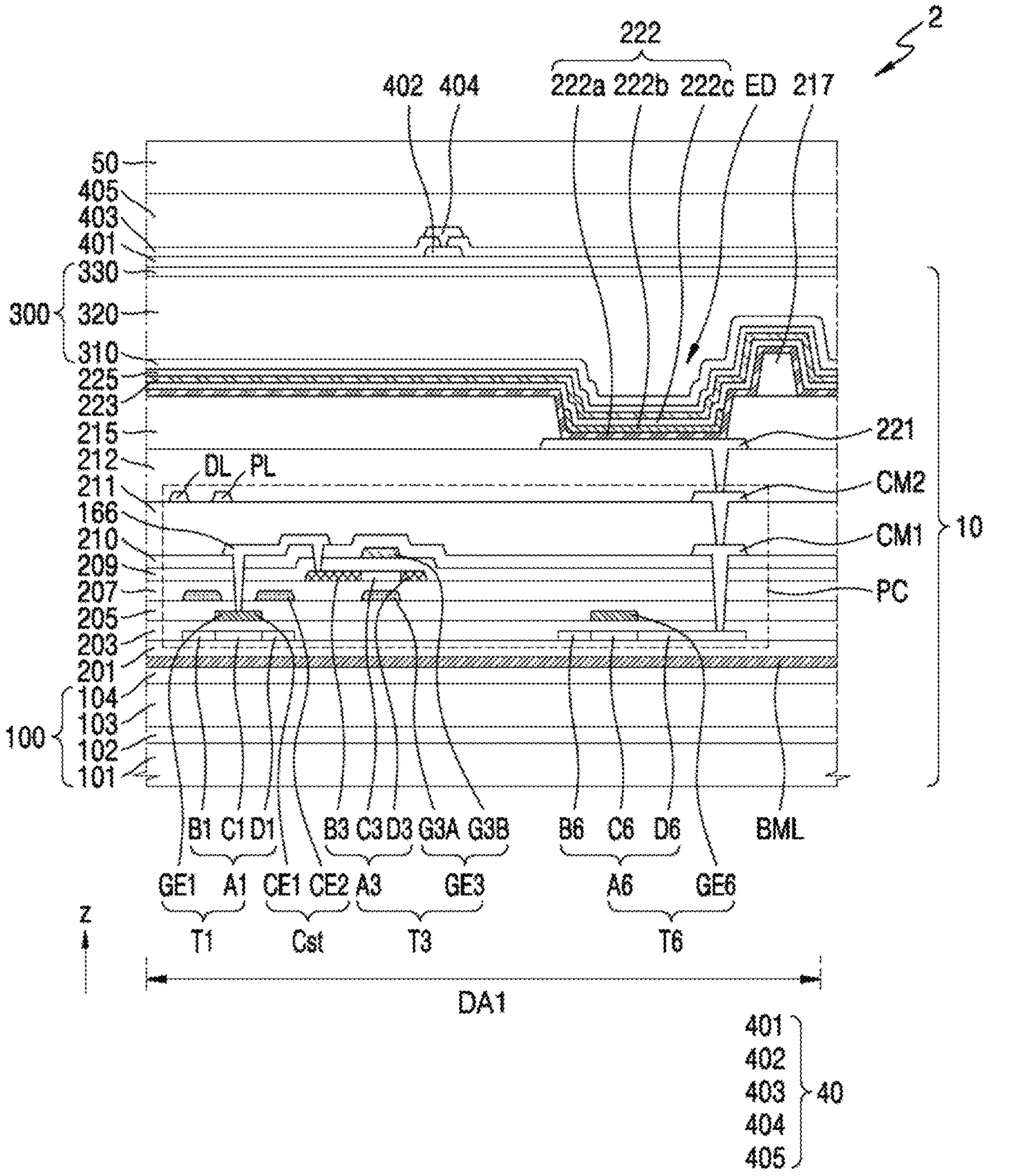
FIG. 5 is a cross-sectional view schematically illustrating a sub-pixel circuit and a light-emitting diode located in a first display area of a display panel, according to one or more embodiments.

FIG. 5 is a cross-sectional view schematically illustrating a sub-pixel circuit and a light-emitting diode located in a first display area of a display panel, according to one or more embodiments.

Referring to FIG. 5, the sub-pixel circuit PC may be located on the substrate 100, and the light-emitting diode ED may be located on the sub-pixel circuit PC.

The substrate 100 may include a first base layer 101, a first barrier layer 102, a second base layer 103, and a second barrier layer 104. The first base layer 101 that is a lowermost layer of the substrate 100 may include a bottom surface of the substrate 100, and the second barrier layer 104 that is an uppermost layer of the substrate 100 may include a top surface of the substrate 100. For example, a bottom surface of the first base layer 101 may be a bottom surface of the substrate 100, and a top surface of the second barrier layer 104 may be a top surface of the substrate 100. In one or more embodiments, the substrate 100 may include a glass material.

Each of the first and second base layers 101 and 103 may include a polymer resin. For example, each of the first and second base layers 101 and 103 may include a polymer resin such as polyethersulfone, polyacrylate, polyetherimide, polyethylene naphthalate, polyethylene terephthalate, polyphenylene sulfide, polyarylate, polyimide, polycarbonate, cellulose triacetate, and/or cellulose acetate propionate. The polymer resin may be transparent.

Each of the first and second barrier layers 102 and 104 may prevent penetration of an external foreign material. Each of the first and second barrier layers 102 and 104 may have a single or multi-layer structure including an inorganic material such as silicon oxide, silicon nitride, and/or silicon oxynitride.

A buffer layer 201 may be located on the top surface of the substrate 100. The buffer layer 201 may prevent penetration of impurities into a semiconductor layer of a transistor. The buffer layer 201 may include an inorganic insulating material such as silicon nitride, silicon oxynitride, or silicon oxide, and may have a single or multi-layer structure including the above inorganic insulating material.

In one or more embodiments, a bottom metal layer BML may be located between the substrate 100 and the buffer layer 201. The bottom metal layer BML may include a metallic material including molybdenum (Mo), aluminum (Al), copper (Cu), and/or titanium (Ti). In one or more embodiments, although the sub-pixel circuit PC entirely overlaps the bottom metal layer BML in FIG. 5, the present disclosure is not limited thereto. In one or more embodiments, the bottom metal layer BML may overlap some transistors selected from among a plurality of transistors included in the sub-pixel circuit PC in a thickness direction of the substrate 100 (e.g., a z direction).

The sub-pixel circuit PC may be located on the buffer layer 201. The sub-pixel circuit PC may include a plurality of thin-film transistors and a storage capacitor as described with reference to FIG. 4. In this regard, FIG. 5 illustrates the first transistor T1, the third transistor T3, the sixth transistor T6, and the storage capacitor Cst.

The first transistor T1 may include a first semiconductor layer A1 on the buffer layer 201 and a first gate electrode GE1 overlapping a channel region C1 of the first semiconductor layer A1 in the thickness direction of the substrate 100 (e.g., the z direction). The first semiconductor layer A1 may include a silicon-based semiconductor material, for example, polysilicon. The first semiconductor layer A1 may include the channel region C1, and a first region B1 and a second region D1 located on opposite sides of the channel region C1. The first region B1 and the second region D1 are regions having a higher impurity concentration than the channel region C1, and one of the first region B1 and the second region D1 may correspond to a source region and the other may correspond to a drain region.

The sixth transistor T6 may include a sixth semiconductor layer A6 on the buffer layer 201 and a sixth gate electrode GE6 overlapping a channel region C6 of the sixth semiconductor layer A6 in the thickness direction of the substrate 100 (e.g., the z direction). The sixth semiconductor layer A6 may include a silicon-based semiconductor material, for example, polysilicon. The sixth semiconductor layer A6 may include the channel region C6, and a first region B6 and a second region D6 located on opposite sides of the channel region C6. The first region B6 and the second region D6 are regions having a higher impurity concentration than the channel region C6, and one of the first region B6 and the second region D6 may correspond to a source region and the other may correspond to a drain region.

Each of the first gate electrode GE1 and the sixth gate electrode GE6 may include a conductive material including molybdenum (Mo), aluminum (Al), copper (Cu), and/or titanium (Ti), and may have a single or multi-layer structure including the above material. A first gate insulating layer 203 for electrical insulation between the first gate electrode GE1 and the first semiconductor layer A1 and between the sixth gate electrode GE6 and the sixth semiconductor layer A6 may be located under the first gate electrode GE1 and the sixth gate electrode GE6 and may cover the first semiconductor layer A1, the sixth semiconductor layer A6, and the buffer layer 201. The first gate insulating layer 203 may include an inorganic insulating material such as silicon nitride, silicon oxynitride, and/or silicon oxide, and may have a single or multi-layer structure including the above inorganic insulating material.

The storage capacitor Cst may include the lower electrode CE1 and the upper electrode CE2 overlapping each other. In one or more embodiments, the lower electrode CE1 of the storage capacitor Cst may include the first gate electrode GE1. In other words, the first gate electrode GE1 may include the lower electrode CE1 of the storage capacitor Cst. For example, the first gate electrode GE1 and the lower electrode CE1 of the storage capacitor Cst may be integrally formed with each other.

A first interlayer insulating layer 205 may be located between the lower electrode CE1 and the upper electrode CE2 of the storage capacitor Cst, and may cover the first gate electrode GE1, the sixth gate electrode GE6, and the first gate insulating layer 203. The first interlayer insulating layer 205 may include an inorganic insulating material such as silicon oxide, silicon nitride, and/or silicon oxynitride, and may have a single or multi-layer structure including the above inorganic insulating material.

The upper electrode CE2 of the storage capacitor Cst may include a low-resistance conductive material such as molybdenum (Mo), aluminum (Al), copper (Cu), and/or titanium (Ti), and may have a single or multi-layer structure including the above material.

A second interlayer insulating layer 207 may be located on the storage capacitor Cst and may cover the upper electrode CE2 and the first interlayer insulating layer 205. The second interlayer insulating layer 207 may include an inorganic insulating material such as silicon oxide, silicon nitride, and/or silicon oxynitride, and may have a single or multi-layer structure including the above inorganic insulating material.

A third semiconductor layer A3 of the third transistor T3 may be located on the second interlayer insulating layer 207. The third semiconductor layer A3 may include an oxide-based semiconductor material. For example, the third semiconductor layer A3 may be formed of a Zn oxide-based material such as Zn oxide, In—Zn oxide, and/or Ga—In—Zn oxide. In one or more embodiments, the third semiconductor layer A3 may be formed of an In—Ga—Zn—O (IGZO), In—Sn—Zn—O (ITZO), and/or In—Ga—Sn—Zn—O (IGTZO) semiconductor containing a metal such as indium (In), gallium (Ga), and/or tin (Sn) in ZnO.

The third semiconductor layer A3 may include a channel region C3, and a first region B3 and a second region D3 located on opposite sides of the channel region C3. Any one of the first region B3 and the second region D3 may correspond to a source region and the other may correspond to a drain region.

The third transistor T3 may include a third gate electrode GE3 overlapping the channel region C3 of the third semiconductor layer A3 in the thickness direction of the substrate 100 (e.g., the z direction). The third gate electrode GE3 may have a dual gate structure including a lower gate electrode G3A located under the third semiconductor layer A3 and an upper gate electrode G3B located over the channel region C3.

The lower gate electrode G3A may be located on the same layer (e.g., the first interlayer insulating layer 205) as the upper electrode CE2 of the storage capacitor Cst. The lower gate electrode G3A may include the same material as the upper electrode CE2 of the storage capacitor Cst.

The upper gate electrode G3B may be located over the third semiconductor layer A3 with a second gate insulating layer 209 therebetween. The second gate insulating layer 209 may include an inorganic insulating material such as silicon oxide, silicon nitride, and/or silicon oxynitride, and may have a single or multi-layer structure including the above inorganic insulating material. The second gate insulating layer 209 may cover the third semiconductor layer A3 and the second interlayer insulating layer 207.

A third interlayer insulating layer 210 may be located on the upper gate electrode G3B and the second gate insulating layer 209. The third interlayer insulating layer 210 may include an inorganic insulating material such as silicon oxynitride, and may have a single or multi-layer structure including the above inorganic insulating material.

Although the upper electrode CE2 of the storage capacitor Cst is located on the same layer as the lower gate electrode G3A of the third gate electrode GE3 in FIG. 5, the present disclosure is not limited thereto. In one or more embodiments, the upper electrode CE2 of the storage capacitor Cst may be located on the same layer as the third semiconductor layer A3, and may include the same material as the first region B3 and the second region D3 of the third semiconductor layer A3.

The first transistor T1 and the third transistor T3 may be electrically connected to each other through the node connection line 166. The node connection line 166 may be located on the third interlayer insulating layer 210. One side of the node connection line 166 may be connected to the first gate electrode GE1 of the first transistor T1, and the other side of the node connection line 166 may be connected to the first region B3 of the third semiconductor layer A3 of the third transistor T3.

The node connection line 166 may include aluminum (Al), copper (Cu), and/or titanium (Ti), and may have a single or multi-layer structure including the above material. For example, the node connection line 166 may have a three-layer structure including a titanium layer, an aluminum layer, and a titanium layer.

A first organic insulating layer 211 may be located on the node connection line 166. The first organic insulating layer 211 may include an organic insulating material. The organic insulating material may include acryl, benzocyclobutene (BCB), polyimide, and/or hexamethyldisiloxane (HMDSO).

The first organic insulating layer 211 may be located on the node connection line 166 and the third interlayer insulating layer 210. The first organic insulating layer 211 may include an organic insulating material. The organic insulating material may include acryl, benzocyclobutene (BCB), polyimide, and/or hexamethyldisiloxane (HMDSO).

The data line DL and the driving voltage line PL may be located on the first organic insulating layer 211. Each of the data line DL and the driving voltage line PL may include aluminum (Al), copper (Cu), and/or titanium (Ti), and may have a single or multi-layer structure including the above material. For example, each of the data line DL and the driving voltage line PL may have a three-layer structure including a titanium layer, an aluminum layer, and a titanium layer.

Although the data line DL and the driving voltage line PL are located on the same layer (e.g., the first organic insulating layer 211) in FIG. 5, in one or more embodiments, the data line DL and the driving voltage line PL may be located on different layers. For example, one of the data line DL and the driving voltage line PL may be located on the first organic insulating layer 211, and the other may be located under the first organic insulating layer 211.

A second organic insulating layer 212 may be located on the first organic insulating layer 211. The second organic insulating layer 212 may include an organic insulating material such as acryl, benzocyclobutene (BCB), polyimide, and/or hexamethyldisiloxane (HMDSO).

A sub-pixel electrode 221 of the light-emitting diode ED may be located on the second organic insulating layer 212. The sub-pixel electrode 221 may be electrically connected to the sixth transistor T6 through first and second connection metals CM1 and CM2. The first connection metal CM1 may be located on the same layer as the node connection line 166, and may include the same material as the node connection line 166. The second connection metal CM2 may be formed on the same layer as the data line DL and/or the driving voltage line PL, and may include the same material as the data line DL and/or the driving voltage line PL.

The sub-pixel electrode 221 of the light-emitting diode ED may include a reflective film including silver (Ag), magnesium (Mg), aluminum (Al), platinum (Pt), palladium (Pd), gold (Au), nickel (Ni), neodymium (Nd), iridium (Ir), chromium (Cr), and/or a compound or mixture thereof. In one or more embodiments, the sub-pixel electrode 221 may further include a conductive oxide layer over and/or under the reflective film. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). For example, the sub-pixel electrode 221 may have a multi-layer structure including an ITO layer, a silver (Ag) layer, and an ITO layer.

A bank layer 215 may be located on the sub-pixel electrode 221 and the second organic insulating layer 212. The bank layer 215 may include a bank opening that overlaps the sub-pixel electrode 221 and defines an emission area, and may cover an edge of the sub-pixel electrode 221. The bank layer 215 may include an organic insulating material such as polyimide.

A spacer 217 may be formed on the bank layer 215. The spacer 217 and the bank layer 215 may be formed together in the same process or may be individually formed in separate processes. In one or more embodiments, the spacer 217 may include an organic insulating material such as polyimide.

An intermediate layer 222 may be on the sub-pixel electrode 221 and may include an emission layer **222*b*. The intermediate layer 222 may also include a first common layer 222*a* located under the emission layer 222*b* and/or a second common layer 222*c* located over the emission layer 222*b*. The emission layer 222*b* may include a high molecular weight organic material or a low molecular weight organic material that emits light of a certain color (e.g., red light, green light, or blue light). In one or more embodiments, the emission layer 222*b*** may include an inorganic material or quantum dots.

The second common layer **222*c* may include an electron transport layer (ETL) and/or an electron injection layer (EIL). Each of the first common layer 222*a* and the second common layer 222*c*** may include an organic material.

The emission layer **222*b* may overlap the sub-pixel electrode 221 of the light-emitting diode ED through the bank opening of the bank layer 215. However, a common layer included in the intermediate layer 222 and including an organic material, for example, the first common layer 222*a*** and the second common layer 222*c*, may be shared by a plurality of light-emitting diodes ED.

The intermediate layer 222 may have a single stack structure including a single emission layer, or a tandem structure that is a multi-stack structure including a plurality of emission layers. When the intermediate layer 222 has a tandem structure, a charge generation layer (CGL) may be located between a plurality of stacks.

A counter electrode 223 may be formed of a conductive material having a low work function. For example, the counter electrode 223 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof. Alternatively, the counter electrode 223 may further include a layer formed of ITO, IZO, ZnO, or $In_2O_3$ on the (semi-) transparent layer including the above material. The counter electrode 223 may be shared by a plurality of light-emitting diodes ED.

An upper layer 225 may be located on the counter electrode 223, and may include a lithium fluoride (LiF) layer and/or a capping layer. The capping layer may include an inorganic material or an organic material.

The light-emitting diode ED may be covered by an encapsulation layer 300. The encapsulation layer 300 may include at least one organic encapsulation layer and at least one inorganic encapsulation layer. In one or more embodiments, in FIG. 7, the encapsulation layer 300 includes a first inorganic encapsulation layer 310 and a second inorganic encapsulation layer 330, and an organic encapsulation layer 320 located between the first and second inorganic encapsulation layers 310 and 330.

Each of the first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and/or silicon oxynitride. Each of the first inorganic encapsulation layer 310 and the second inorganic encapsulation layer 330 may have a single or multi-layer structure including the above material. The organic encapsulation layer 320 may include a polymer-based material. Examples of the polymer-based material may include an acrylic resin, an epoxy resin, polyimide, and polyethylene. In one or more embodiments, the organic encapsulation layer 320 may include acrylate.

The input sensing layer 40 may be located on the encapsulation layer 300 of the display layer 10. The input sensing layer 40 may include a first insulating layer 401, a first conductive layer 402, a second insulating layer 403, a second conductive layer 404, and a third insulating layer 405. The input sensing layer 40 may include a touch electrode, and the first conductive layer 402 and/or the second conductive layer 404 of the input sensing layer 40 may include a touch electrode. In one or more embodiments, the second conductive layer 404 may include a certain pattern (e.g., a mesh pattern) corresponding to each of a plurality of touch electrodes, and the first conductive layer 402 may include a connection electrode of a mesh pattern that connects adjacent touch electrodes. Each of the first insulating layer 401 and the second insulating layer 403 may include an inorganic insulating material, and the third insulating layer 405 may include an organic insulating material. In FIG. 5, in one or more embodiments, the optical functional layer 50 includes an anti-reflection layer such as a polarizing plate.

Figure 6:
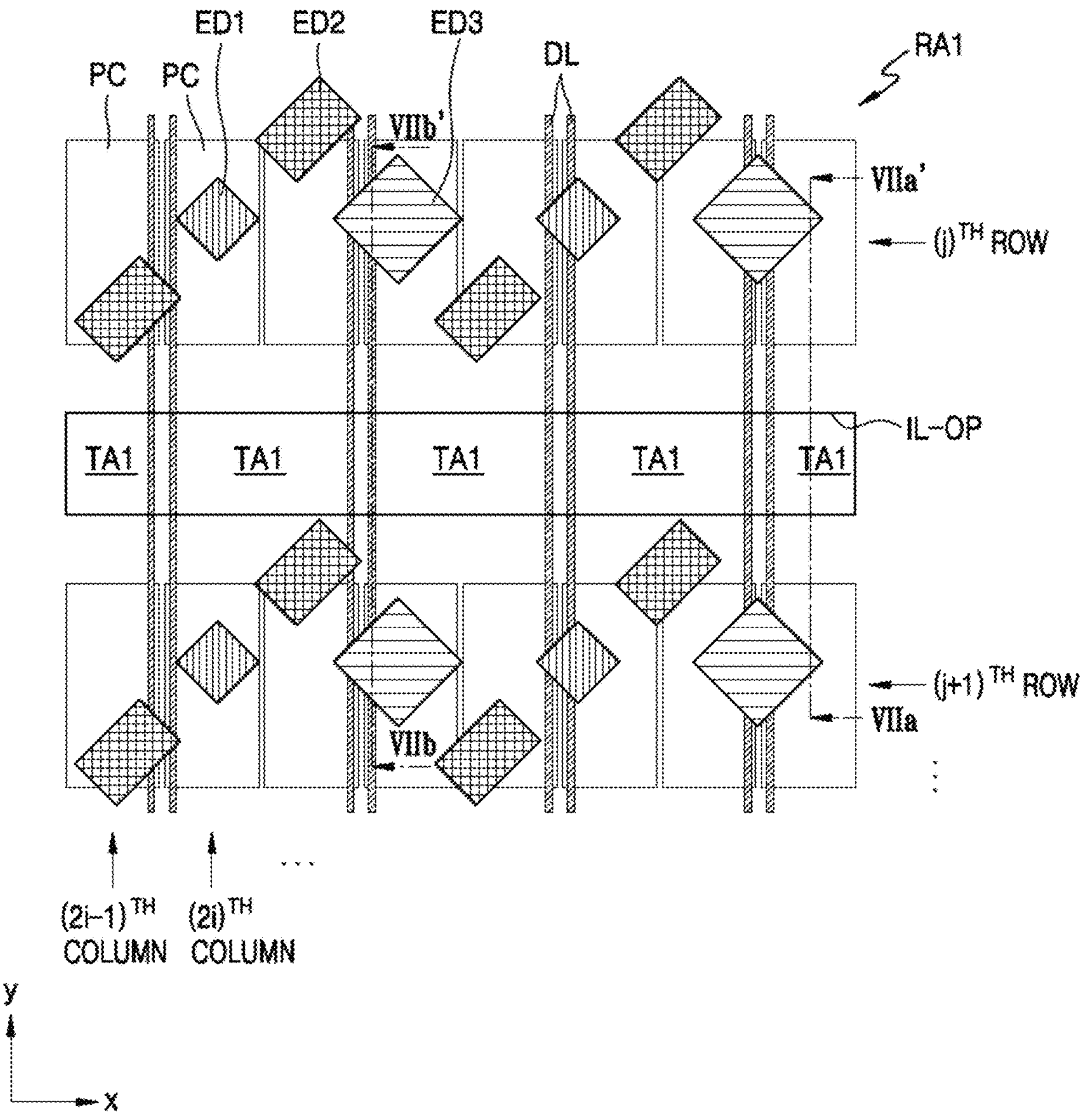
FIG. 6 is a plan view schematically illustrating a part of a first area of a display panel, according to one or more embodiments.

FIG. 6 is a plan view schematically illustrating a part of a first area of a display panel, according to one or more embodiments.

Referring to FIG. 6, sub-pixel circuits PC and light-emitting diodes electrically connected to the sub-pixel circuits PC may be located in the first area RA1. In one or more embodiments, FIG. 6 illustrates light-emitting diodes emitting light of different colors, for example, a first light-emitting diode ED1 emitting light of a first color, a second light-emitting diode ED2 emitting light of a second color, and a third light-emitting diode ED3 emitting light of a third color. The first light-emitting diode ED1, the second light-emitting diode ED2, and the third light-emitting diode ED3 may be arranged according to a certain rule.

The sub-pixel circuits PC may be arranged in the first direction (e.g., the x direction) and a second direction (e.g., a y direction) perpendicular to the first direction (e.g., the x direction). A plurality of inorganic insulating layers may be located on a substrate. To ensure a transmittance, at least one of the plurality of inorganic insulating layers may include an opening IL-OP located between the sub-pixel circuits PC of a $(j)^{th}$ row and the sub-pixel circuits PC of a $(j+1)^{th}$ row arranged in the first direction (e.g., the x direction) (where j is a positive integer). The opening IL-OP of the at least one inorganic insulating layer overlaps the first transmissive area TA1.

Each of the sub-pixel circuits PC may be electrically connected to the data line DL. For example, the sub-pixel circuits PC arranged in the second direction (e.g., the y direction) may be electrically connected to the same data line DL. Every two of the data lines DL located in the first area RA1 may be adjacent to each other. For example, the data line DL electrically connected to the sub-pixel circuits PC arranged in a $(2i-1)^{th}$ column and the data line DL electrically connected to the sub-pixel circuits PC arranged in a $(2i)^{th}$ column may be symmetrical to each other with respect to a virtual line passing between the $(2i-1)^{th}$ column and the $(2i)^{th}$ column (where i is a positive integer).

The first transmissive area TA1 may be located between neighboring sub-pixel circuits PC in the second direction (e.g., the y direction). A structure around the first transmissive area TA1 will be described with reference to FIGS. 7 to 14.

Figure 7:
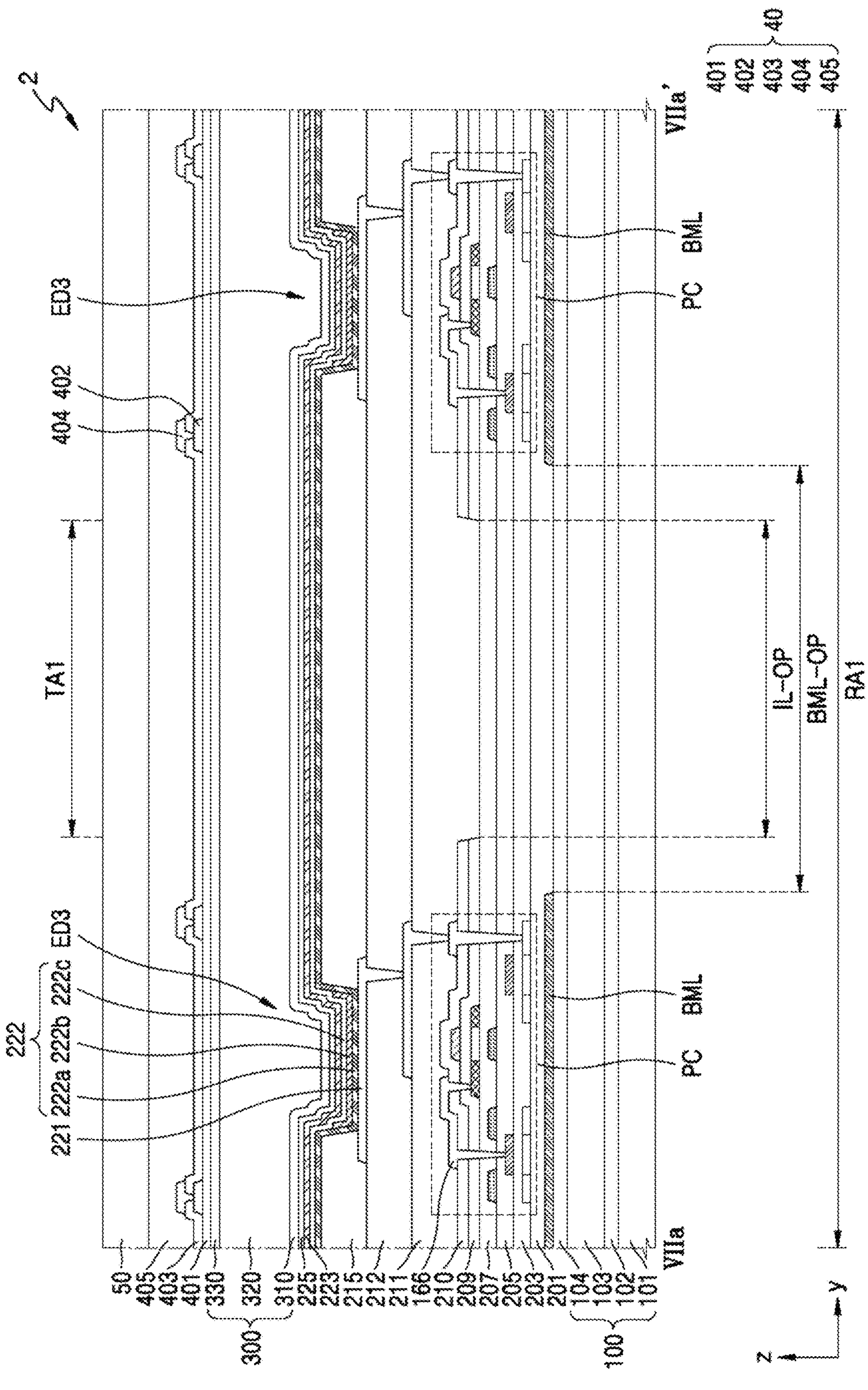
FIG. 7 is a cross-sectional view illustrating a part of the display panel, taken along the line VIIa-VIIa' of FIG. 6, according to one or more embodiments.

FIG. 7 is a cross-sectional view illustrating a part of the display panel, taken along the line VIIa-VIIa' of FIG. 6, according to one or more embodiments.

FIG. 7 illustrates the sub-pixel circuits PC located on the substrate 100 to be spaced from each other with the first transmissive area TA1 therebetween in the first area RA1, and the third light-emitting diode ED3 connected to each of the sub-pixel circuits PC. Specific structures of the substrate 100 and the sub-pixel circuits PC are the same as those described with reference to FIG. 5.

At least one of inorganic insulating layers located between the substrate 100 and each light-emitting diode, for example, the third light-emitting diode ED3, from among layers included in the display layer 10 may include the opening IL-OP overlapping the first transmissive area TA1. For example, the opening IL-OP may be formed by removing a part of at least one inorganic insulating layer selected from among the first gate insulating layer 203, the first interlayer insulating layer 205, the second interlayer insulating layer 207, the second gate insulating layer 209, and the third interlayer insulating layer 210 located between the substrate 100 and the sub-pixel electrode 221. In one or more embodiments, in FIG. 7, the opening IL-OP is formed by removing a part of each of the second gate insulating layer 209 and the third interlayer insulating layer 210.

Referring to FIG. 7, an opening BML-OP of the bottom metal layer BML and the opening IL-OP of at least one inorganic insulating layer, for example, the opening IL-OP formed in a stacked structure of the second gate insulating layer 209 and the third interlayer insulating layer 210, may overlap each other in the z direction, but may have different sizes. In one or more embodiments, a width of the opening IL-OP of the at least one inorganic insulating layer may be less than a width of the opening BML-OP of the bottom metal layer BML in the y direction. The opening BML-OP of the bottom metal layer BML may overlap the first transmissive area TA1 in the z direction. In one or more embodiments, a width of the first transmissive area TA1 may be substantially the same as a width of the opening IL-OP of the at least one inorganic insulating layer in the y direction.

The opening IL-OP of the at least one inorganic insulating layer may be at least partially filled with an organic insulating material. For example, the opening IL-OP of the at least one inorganic insulating layer may be at least partially filled by a part of the first organic insulating layer 211.

A common layer, for example, the first common layer 222*a* and the second common layer 222*c*, may be located on the bank layer 215, and may overlap the first transmissive area TA1, the opening BML-OP of the bottom metal layer BML, and/or the opening IL-OP of the at least one inorganic insulating layer in the z direction. The counter electrode 223 on the common layer may overlap the first transmissive area TA1, the opening BML-OP of the bottom metal layer BML, and/or the opening IL-OP of the at least one inorganic insulating layer in the z direction. The upper layer 225 on the counter electrode 223 may overlap the first transmissive area TA1, the opening BML-OP of the bottom metal layer BML, and/or the opening IL-OP of the at least one inorganic insulating layer in the z direction.

Each of the first inorganic encapsulation layer 310, the organic encapsulation layer 320, and the second inorganic encapsulation layer 330 of the encapsulation layer 300 may overlap the first transmissive area TA1, the opening BML-OP of the bottom metal layer BML, and/or the opening IL-OP of the at least one inorganic insulating layer in the z direction.

Each of the first insulating layer 401, the second insulating layer 403, and the third insulating layer 405 of the input sensing layer 40 and the optical functional layer 50 may overlap the first transmissive area TA1, the opening BML-OP of the bottom metal layer BML, and/or the opening IL-OP of the at least one inorganic insulating layer in the z direction.

Figure 8:
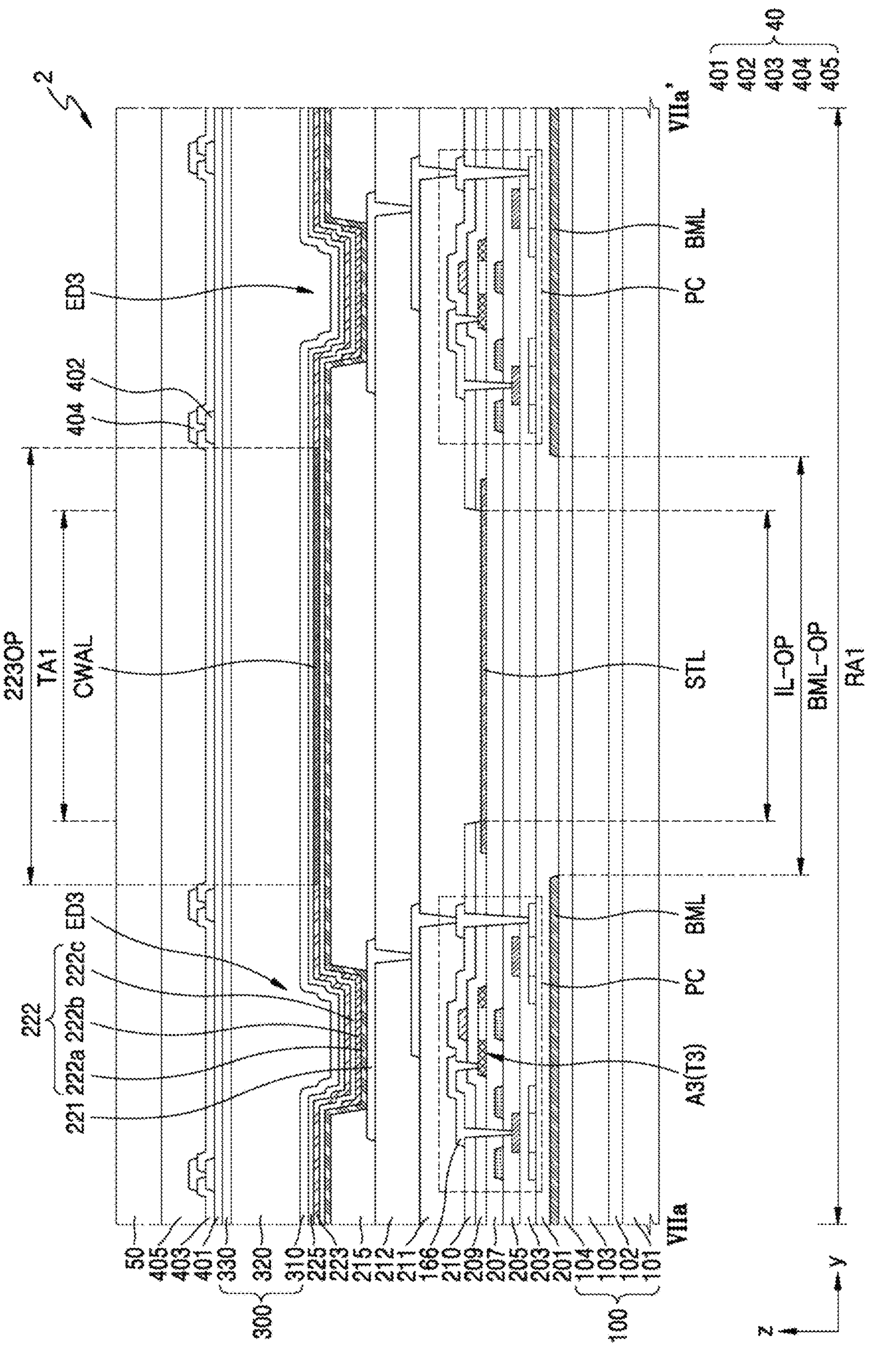
FIG. 8 is a cross-sectional view illustrating a part of the display panel, taken along the line VIIa-VIIa' of FIG. 6, according to one or more embodiments.

FIG. 8 is a cross-sectional view illustrating a part of the display panel, taken along the line VIIa-VIIa' of FIG. 6, according to one or more embodiments. The display panel 2 according to one or more embodiments of FIG. 8 may include the structure described with reference to FIG. 7, and may further include an etch stopper layer STL and an anti-deposition layer CWAL. The same elements as those of FIG. 7 will not be described, and a difference will be mainly described.

The etch stopper layer STL may be located under at least one inorganic insulating layer including the opening IL-OP. The etch stopper layer STL may overlap the opening IL-OP. A top surface of the etch stopper layer STL may be a bottom surface of the opening IL-OP. According to one or more embodiments, the etch stopper layer STL may include the same material as the third semiconductor layer A3 of the third transistor T3 of the sub-pixel circuit PC. For example, the etch stopper layer STL may include an oxide-based semiconductor material.

In one or more embodiments, the counter electrode 223 may include an opening 223OP. When the counter electrode 223 includes the opening 223OP, a transmittance of the first transmissive area TA1 may further increase. The opening 223OP of the counter electrode 223 may overlap the first transmissive area TA1, the opening BML-OP of the bottom metal layer BML, and/or the opening IL-OP of the at least one inorganic insulating layer.

In one or more embodiments, before a deposition process for forming the counter electrode 223, the anti-deposition layer CWAL may be formed to overlap the first transmissive area TA1, the opening BML-OP of the bottom metal layer BML, and/or the opening IL-OP of the at least one inorganic insulating layer. When the anti-deposition layer CWAL is formed on the second common layer 222*c* and then a deposition process for forming the counter electrode 223 is performed, the counter electrode 223 may not be formed on the anti-deposition layer CWAL. In other words, the opening 223OP of the counter electrode 223 may overlap the anti-deposition layer CWAL. The upper layer 225 may be formed on a top surface of the anti-deposition layer CWAL. The anti-deposition layer CWAL may be formed of an organic material including a fluorine group.

Figure 9:
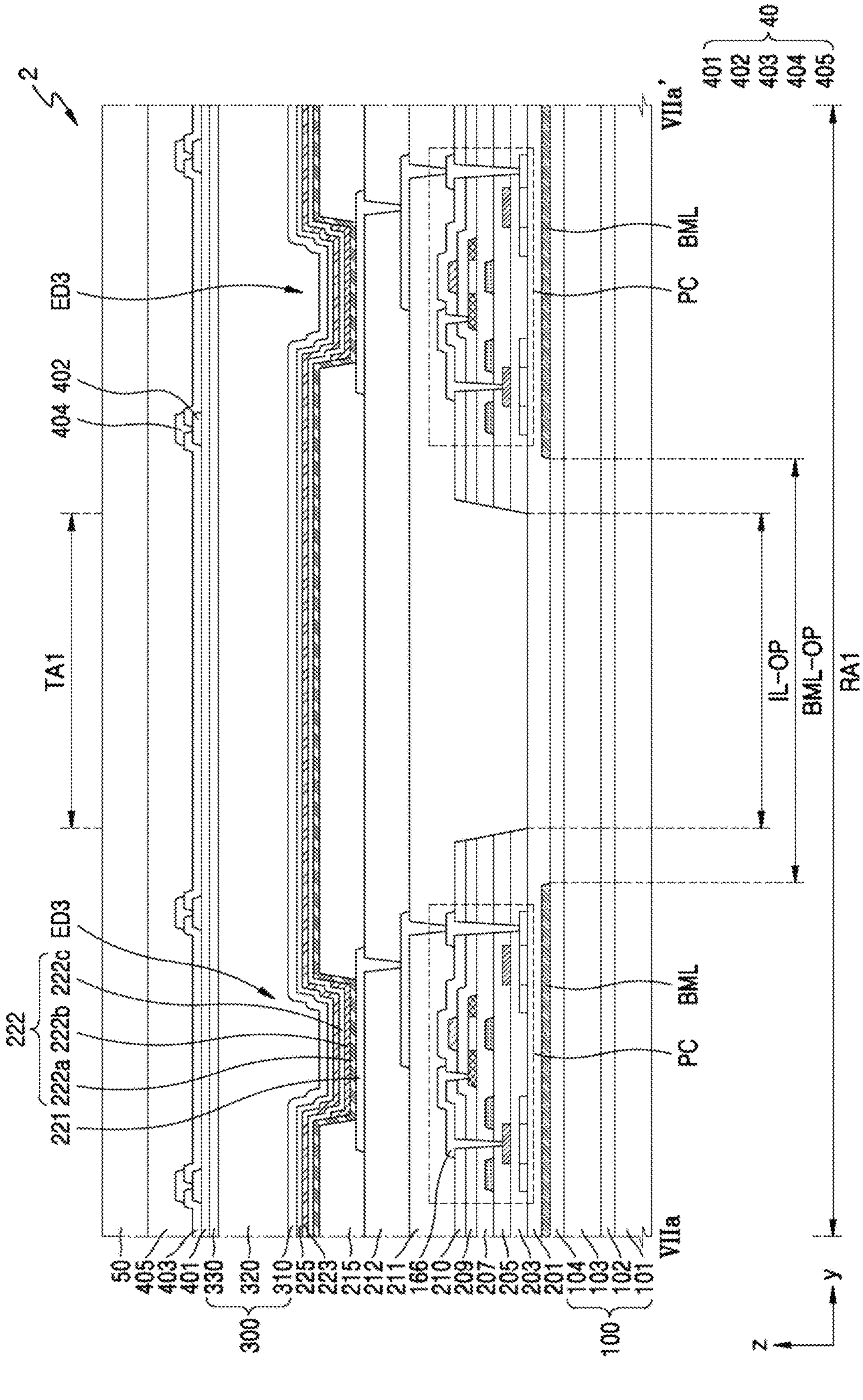
FIG. 9 is a cross-sectional view illustrating a part of the display panel, taken along the line VIIa-VIIa' of FIG. 6, according to one or more embodiments.

FIG. 9 is a cross-sectional view illustrating a part of the display panel, taken along the line VIIa-VIIa' of FIG. 6, according to one or more embodiments. Although the opening IL-OP of at least one inorganic insulating layer is formed by removing a part of the second gate insulating layer 209 and a part of the third interlayer insulating layer 210 in FIGS. 7 and 8, the present disclosure is not limited thereto.

In one or more embodiments, the opening IL-OP of the at least one inorganic insulating layer may be formed by removing a part of each of the first gate insulating layer 203, the first interlayer insulating layer 205, the second interlayer insulating layer 207, the second gate insulating layer 209, and the third interlayer insulating layer 210.

The opening IL-OP of the at least one inorganic insulating layer may be at least partially filled by a part of an organic insulating material, for example, a part of the first organic insulating layer 211. A side surface of the first gate insulating layer 203, a side surface of the first interlayer insulating layer 205, a side surface of the second interlayer insulating layer 207, a side surface of the second gate insulating layer 209, and a side surface of the third interlayer insulating layer 210 facing the opening IL-OP may directly contact the first organic insulating layer 211.

Other elements of the display panel 2 according to the embodiment of FIG. 9 are the same as those described with reference to FIG. 7.

Figure 10:
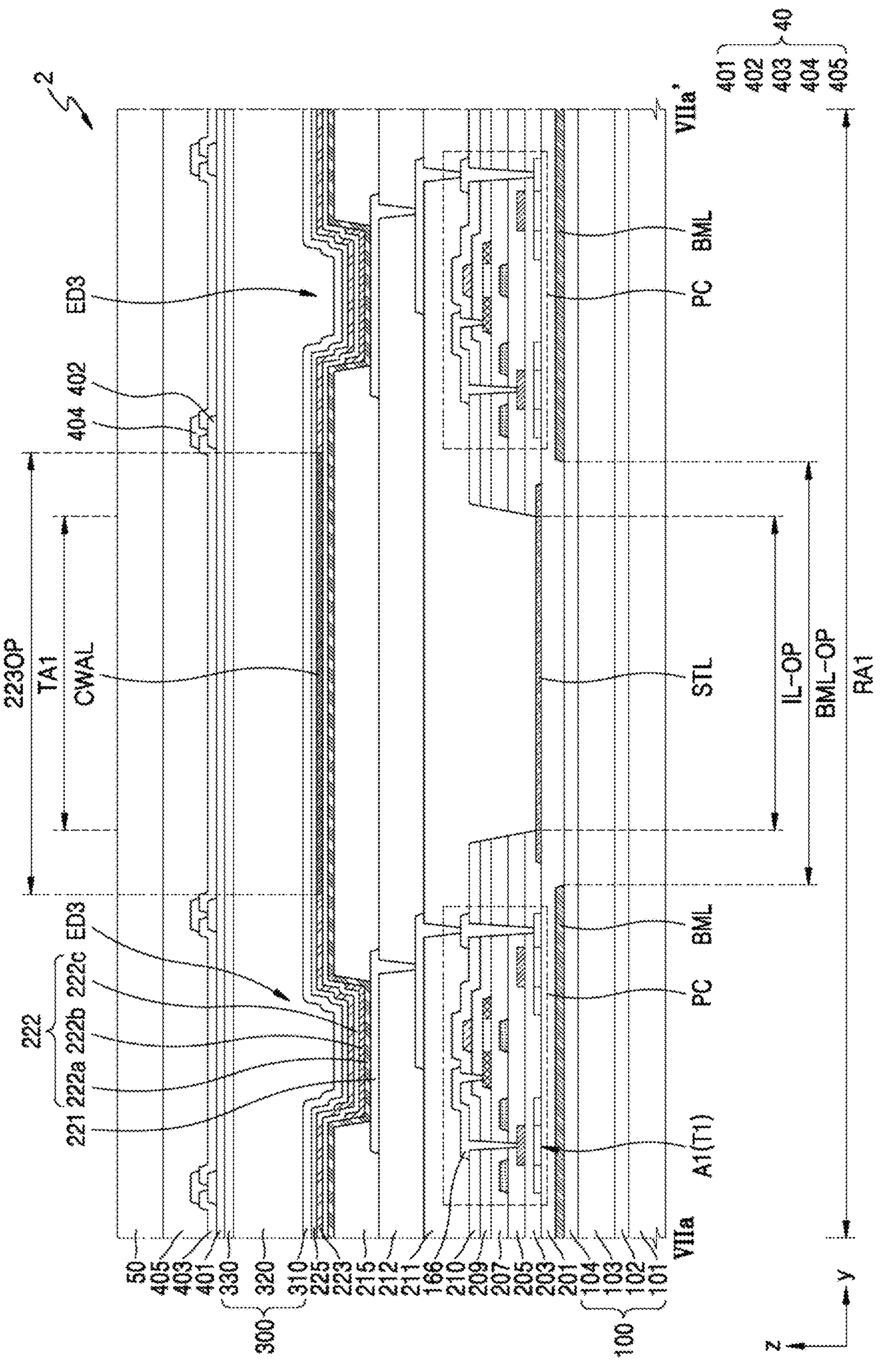
FIG. 10 is a cross-sectional view illustrating a part of the display panel, taken along the line VIIa-VIIa' of FIG. 6, according to one or more embodiments.

FIG. 10 is a cross-sectional view illustrating a part of the display panel, taken along the line VIIa-VIIa' of FIG. 6, according to one or more embodiments.

The display panel 2 according to one or more embodiments of FIG. 10 may include the structure described with reference to FIG. 9, and may further include the etch stopper layer STL and the anti-deposition layer CWAL. The same elements as those of FIGS. 7 and 9 will not be described, and a difference will be mainly described.

The etch stopper layer STL may be located under at least one inorganic insulating layer including the opening IL-OP. For example, the etch stopper layer STL may be located under the first gate insulating layer 203. The etch stopper layer STL may be located between the buffer layer 201 and the first gate insulating layer 203, and may include the same material as the first semiconductor layer A1 of the first transistor T1.

In one or more embodiments, the counter electrode 223 may include the opening 223OP. The opening 223OP of the counter electrode 223 may overlap the first transmissive area TA1, the opening BML-OP of the bottom metal layer BML, and/or the opening IL-OP of the at least one inorganic insulating layer. The opening 223OP of the counter electrode 223 may overlap the anti-deposition layer CWAL including a fluorine group as described with reference to FIG. 8.

Figure 11:
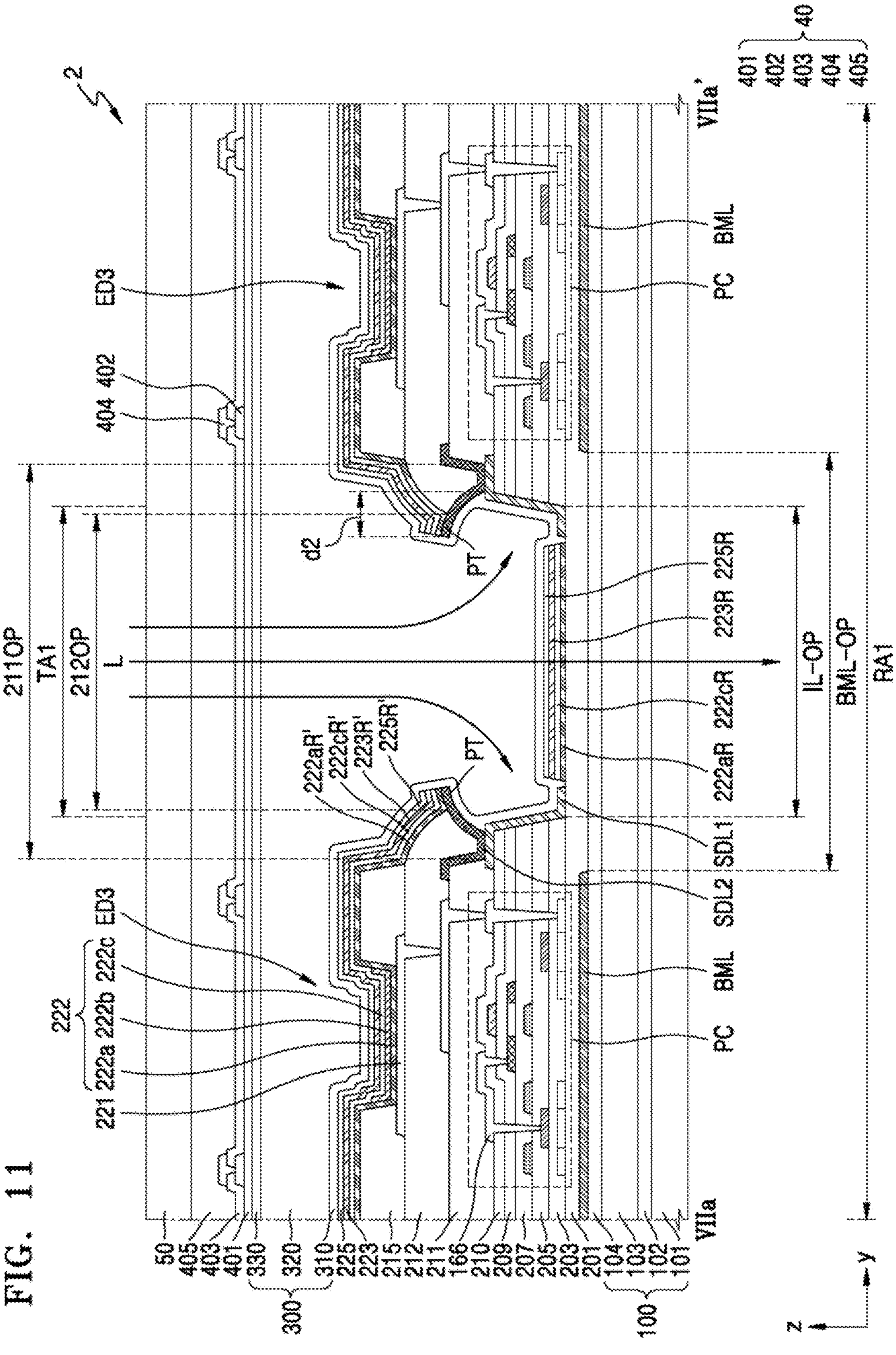
FIG. 11 is a cross-sectional view illustrating a part of the display panel, taken along the line VIIa-VIIa' of FIG. 6, according to one or more embodiments.

FIG. 11 is a cross-sectional view illustrating a part of the display panel, taken along line VIIa-VIIa' of FIG. 6, according to an embodiment.

FIG. 11 illustrates the sub-pixel circuits PC located on the substrate 100 to be spaced from each other with the first transmissive area TA1 therebetween in the first area RA1, and the third light-emitting diode ED3 connected to each of the sub-pixel circuits PC. Specific structures of the substrate 100 and the sub-pixel circuits PC are the same as those described with reference to FIG. 5.

At least one of inorganic insulating layers located between the substrate 100 and the sub-pixel electrode 221 from among layers included in the display layer 10 may include the opening IL-OP overlapping the first transmissive area TA1. The opening IL-OP may be formed by removing a part of at least one from among the first gate insulating layer 203, the first interlayer insulating layer 205, the second interlayer insulating layer 207, the second gate insulating layer 209, and the third interlayer insulating layer 210 located between the substrate 100 and the sub-pixel electrode 221. In one or more embodiments, in FIG. 11, the opening IL-OP is formed by removing a part of the first gate insulating layer 203, a part of the first interlayer insulating layer 205, a part of the second interlayer insulating layer 207, a part of the second gate insulating layer 209, and a part of the third interlayer insulating layer 210. In other words, the opening IL-OP may be formed when an opening of the first gate insulating layer 203, an opening of the first interlayer insulating layer 205, an opening of the second interlayer insulating layer 207, an opening of the second gate insulating layer 209, and an opening of the third interlayer insulating layer 210 overlap each other.

An eaves structure or an overhang structure having a tip protruding toward the opening IL-OP may be located around the opening IL-OP of the at least one inorganic insulating layer. For example, the eaves structure or the overhang structure may be located on opposite sides of the opening IL-OP. In one or more embodiments, a second conductive layer SDL2 on a first conductive layer SDL1 may include a tip PT protruding toward the opening IL-OP of the at least one inorganic insulating layer. A certain eaves structure or overhang structure may be formed due to the tip PT.

A first portion of the first conductive layer SDL1 may be located on a top surface of at least one inorganic insulating layer, for example, the third interlayer insulating layer 210, and a second portion of the first conductive layer SDL1 opposite to the first portion may extend toward the opening IL-OP. The first conductive layer SDL1 may overlap a side surface of the at least one inorganic insulating layer facing the opening IL-OP. For example, the first conductive layer SDL1 may directly contact the side surface of the at least one inorganic insulating layer facing the opening IL-OP. A first portion of the first conductive layer SDL1 may directly contact the top surface of the third interlayer insulating layer 210, and a second portion of the first conductive layer SDL1 may directly contact a bottom surface of the opening IL-OP (e.g., a top surface of the buffer layer 201).

A first portion of the second conductive layer SDL2 may be located on the first organic insulating layer 211, and a second portion of the second conductive layer SDL2 may protrude toward the opening IL-OP of the at least one inorganic insulating layer to form an eaves structure or an overhang structure.

In one or more embodiments, the first and second common layers 222*a* and 222*c*, the counter electrode 223, and the upper layer 225 may be separated around the tip PT due to the eaves structure or the overhang structure of the tip PT of the second conductive layer SDL2.

The first and second common layers 222*a* and 222*c* may respectively include first portions 222*a*R and 222*c*R overlapping the opening IL-OP of the at least one inorganic insulating layer and second portions 222*a*R' and 222*c*R' located on the tip PT of the second conductive layer SDL2. The first portions 222*a*R and 222*c*R of the first and second common layers 222*a* and 222*c* may be separated from the second portions 222*a*R' and 222*c*R'. The first portions 222*a*R and 222*c*R of the first and second common layers 222*a* and 222*c* may be located at different levels from the second portions 222*a*R' and 222*c*R'. In other words, a vertical distance from a top surface of the substrate 100 to the first portions 222*a*R and 222*c*R of the first and second common layers 222*a* and 222*c* in a direction (e.g., a +z direction) perpendicular to the top surface of the substrate 100 may be less than a vertical distance from the top surface of the substrate 100 to the second portions 222*a*R' and 222*c*R' of the first and second common layers 222*a* and 222*c*.

The counter electrode 223 may include a first portion 223R overlapping the opening IL-OP of the at least one inorganic insulating layer and a second portion 223R' located on the tip PT of the second conductive layer SDL2. The first portion 223R of the counter electrode 223 may be separated from the second portion 223R'. The first portion 223R of the counter electrode 223 may be located at a different level from the second portion 223R'. In other words, a vertical distance from the top surface of the substrate 100 to the first portion 223R of the counter electrode 223 in the direction (e.g., the +z direction) perpendicular to the top surface of the substrate 100 may be less than a vertical distance from the top surface of the substrate 100 to the second portion 223R' of the counter electrode 223.

The upper layer 225 may include a first portion 225R overlapping the opening IL-OP of the at least one inorganic insulating layer and a second portion 225R' located on the tip PT of the second conductive layer SDL2. The first portion 225R of the upper layer 225 may be separated from the second portion 225R'. The first portion 225R and the second portion 225R' of the upper layer 225 may be located at different levels. In other words, a vertical distance from the top surface of the substrate 100 to the first portion 225R of the upper layer 225 in the direction (e.g., the +z direction) perpendicular to the top surface of the substrate 100 may be less than a vertical distance from the top surface of the substrate 100 to the second portion 225R' of the upper layer 225.

The opening IL-OP of the at least one inorganic insulating layer and the opening BML-OP of the bottom metal layer BML may overlap each other, but may have different sizes. In one or more embodiments, a width of the opening IL-OP of the at least one inorganic insulating layer may be less than a width of the opening BML-OP of the bottom metal layer BML. The opening BML-OP of the bottom metal layer BML may overlap the first transmissive area TA1.

A side surface (or an edge) of the bottom metal layer BML facing the opening BML-OP of the bottom metal layer BML may be farther from the opening IL-OP of the at least one inorganic insulating layer than the tip PT of the second conductive layer SDL2. In other words, a distance (e.g., a horizontal distance parallel to the top surface of the substrate 100) between the tips PT of the second conductive layers SDL2 facing each other may be less than a width of the opening BML-OP of the bottom metal layer BML.

The first organic insulating layer 211 may include an opening 211OP overlapping the opening IL-OP of the at least one inorganic insulating layer and/or the first transmissive area TA1. The second organic insulating layer 212 may include an opening 212OP overlapping the opening IL-OP of the at least one inorganic insulating layer and/or the first transmissive area TA1. The opening 211OP of the first organic insulating layer 211 and the opening 212OP of the second organic insulating layer 212 may overlap each other, but may have different widths. A width of the opening 211OP of the first organic insulating layer 211 may be greater than a width of the opening 212OP of the second organic insulating layer 212. A transmittance of the first transmissive area TA1 may increase through the opening 211OP of the first organic insulating layer 211 and the opening 212OP of the second organic insulating layer 212.

The first inorganic encapsulation layer 310 may be located on the upper layer 225. The first inorganic encapsulation layer 310 may overlap a light-emitting diode, for example, the third light-emitting diode ED3, and may extend toward the first transmissive area TA1. The first inorganic encapsulation layer 310 formed by using chemical vapor deposition or the like may have relatively excellent step coverage, unlike the first and second common layers 222*a* and 222*c* or the counter electrode 223. Accordingly, despite the eaves structure or the overhang structure of the tip PT of the second conductive layer SDL2, the first inorganic encapsulation layer 310 may be continuously formed without being separated like the first and second common layers 222*a* and 222*c* or the counter electrode 223. The first inorganic encapsulation layer 310 may continuously overlap a stacked structure of the second portion 225R' of the upper layer 225, the second portion 223R' of the counter electrode 223, and the second portions 222*a*R' and 222*c*R' of the first and second common layers 222*a* and 222*c*, a side surface and a bottom surface of the tip PT of the second conductive layer SDL2, a top surface and a side surface of the first conductive layer SDL1 under the tip PT, and a stacked structure of the first portion 225R of the upper layer 225, the first portion 223R of the counter electrode 223, and the first portions 222*a*R and 222*c*R of the first and second common layers 222*a* and 222*c*. In other words, the first inorganic encapsulation layer 310 may continuously extend to overlap the tip PT of the second conductive layer SDL2, a part of the first conductive layer SDL1 on a side surface of the at least one inorganic insulating layer facing the opening IL-OP of the at least one inorganic insulating layer, and the opening IL-OP of the at least one inorganic insulating layer. The first inorganic encapsulation layer 310 may directly contact a top surface of a part of the first conductive layer SDL1 located on a side surface of the at least one inorganic insulating layer defining the opening IL-OP.

As described with reference to FIG. 2A, the first component 31 (see FIG. 2A) may be located under the substrate 100 (e.g., on a bottom surface of the substrate 100) to correspond to the first area RA1. In one or more embodiments, when the first component 31 (see FIG. 2A) is a light receiver that receives light L (see FIG. 11) reflected from a user's body part, the light L may travel toward the first component 31 (see FIG. 2A) through the first transmissive area TA1. Although part of the light L may travel toward transistors of the sub-pixel circuit PC around the first transmissive area TA1, the light L may be prevented from traveling toward the transistors of the sub-pixel circuit PC around the first transmissive area TA1 due to a structure of the first conductive layer SDL1 and the second conductive layer SDL2.

In a comparative example of the present disclosure, when the reflected light L travels toward the transistors of the subpixel circuit PC, the performance of the transistors may be changed or degraded. However, this problem may be prevented by the structure of the first conductive layer SDL1 and the second conductive layer SDL2 that is a light-blocking structure. Although the light L travels from the outside toward the first component 31 (see FIG. 2A) under the display panel 2 (e.g., in a −z direction) in FIG. 11, the present disclosure is not limited thereto. In one or more embodiments, the light L may travel from the first component 31 (see FIG. 2A) under the display panel 2 to the outside (e.g., in the +z direction). In this case, the first component 31 may not be a light receiver that receives light but may be a light emitter that emits light.

The opening IL-OP of the at least one inorganic insulating layer may be at least partially filled with an organic insulating material. For example, a part of the organic encapsulation layer 320 may at least partially fill the opening IL-OP of the at least one inorganic insulating layer.

Figure 12:
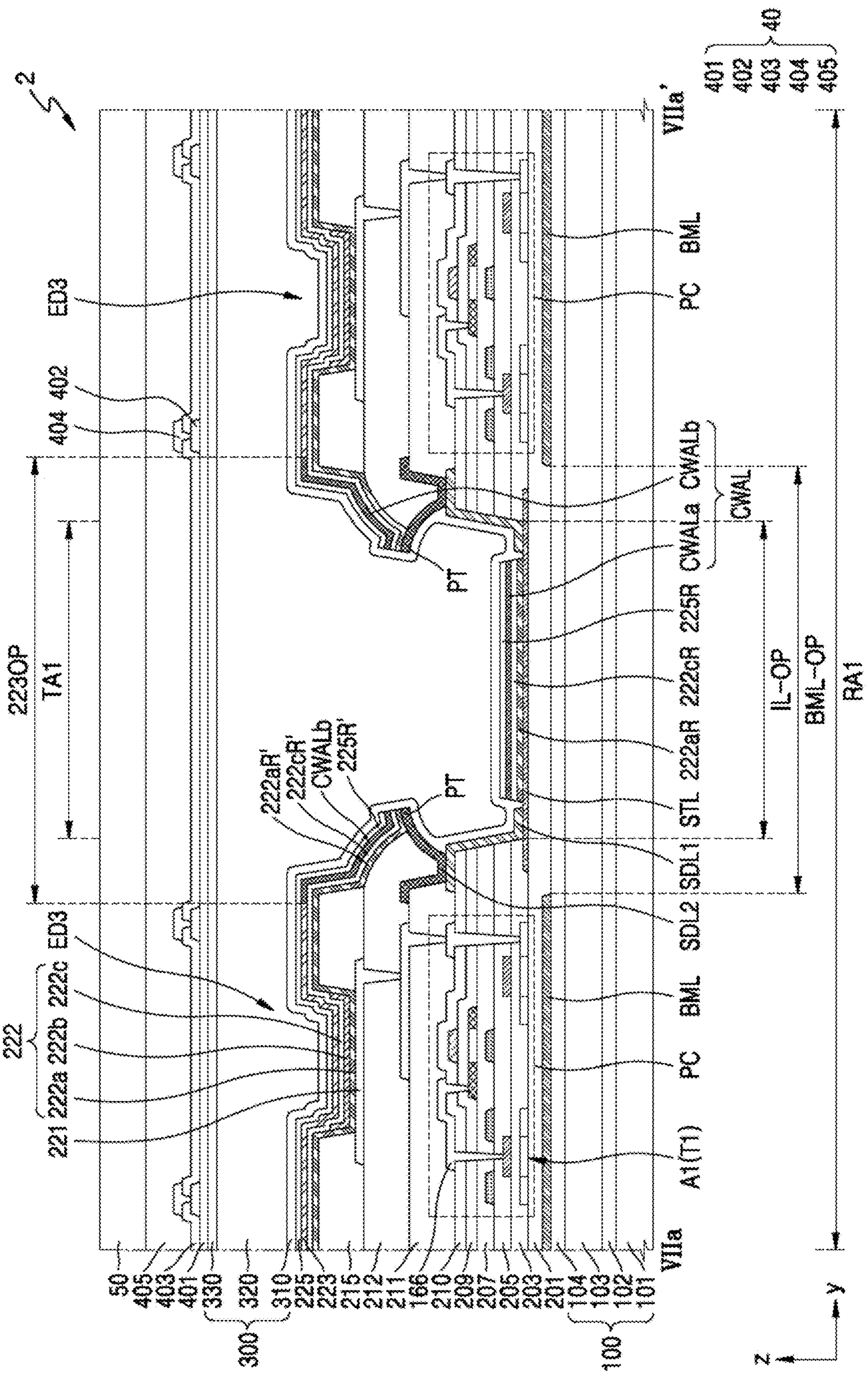
FIG. 12 is a cross-sectional view illustrating a part of the display panel, taken along the line VIIa-VIIa' of FIG. 6, according to one or more embodiments.

FIG. 12 is a cross-sectional view illustrating a part of the display panel, taken along the line VIIa-VIIa' of FIG. 6, according to one or more embodiments.

The display panel 2 according to one or more embodiments of FIG. 12 may include the structure described with reference to FIG. 11, and may further include the etch stopper layer STL and the anti-deposition layer CWAL. The same elements as those of FIG. 11 will not be described, and a difference will be mainly described.

The etch stopper layer STL may be located under at least one inorganic insulating layer including the opening IL-OP. For example, the etch stopper layer STL may be located under the first gate insulating layer 203. The etch stopper layer STL may be located between the buffer layer 201 and the first gate insulating layer 203, and may include the same material as the first semiconductor layer A1 of the first transistor T1.

In one or more embodiments, the counter electrode 223 may include an opening 223OP. The opening 223OP of the counter electrode 223 may overlap the first transmissive area TA1, the opening BML-OP of the bottom metal layer BML, and/or the opening IL-OP of the at least one inorganic insulating layer. The opening 223OP of the counter electrode 223 may overlap the anti-deposition layer CWAL as described with reference to FIG. 8. A width of the opening 223OP of the counter electrode 223 may be substantially the same as a width of the anti-deposition layer CWAL.

In one or more embodiments, before a deposition process for forming the counter electrode 223, the anti-deposition layer CWAL may be formed to overlap the first transmissive area TA1, the opening BML-OP of the bottom metal layer BML, and/or the opening IL-OP of the at least one inorganic insulating layer.

The anti-deposition layer CWAL may be formed on the second common layer 222*c*. Like the second common layer 222*c*, the anti-deposition layer CWAL may include a plurality of portions separated around a structure of the tip PT of the second conductive layer SDL2. For example, the anti-deposition layer CWAL may include a first portion CWALa overlapping the opening IL-OP of the at least one inorganic insulating layer and a second portion CWALb located on the tip PT of the second conductive layer SDL2. The first portion 225R of the upper layer 225 may be located on the first portion CWALa of the anti-deposition layer CWAL, and the second portion 225R' of the upper layer 225 may be located on the second portion CWALb of the anti-deposition layer CWAL.

Although the opening IL-OP of the at least one inorganic insulating layer is formed by removing a part of each of the first gate insulating layer 203, the first interlayer insulating layer 205, the second interlayer insulating layer 207, the second gate insulating layer 209, and the third interlayer insulating layer 210 in FIGS. 11 and 12, the present disclosure is not limited thereto. In one or more embodiments, the opening IL-OP of the at least one inorganic insulating layer of FIG. 11 may be formed by removing a part of each of the second gate insulating layer 209 and the third interlayer insulating layer 210 as shown in FIG. 7 or 8. In this case, as described with reference to FIG. 8, the etch stopper layer STL of FIG. 12 may be located on the second interlayer insulating layer 207, and may include the same material as the third semiconductor layer A3 (see FIG. 8) of the third transistor T3 (see FIG. 8).

Figure 13:
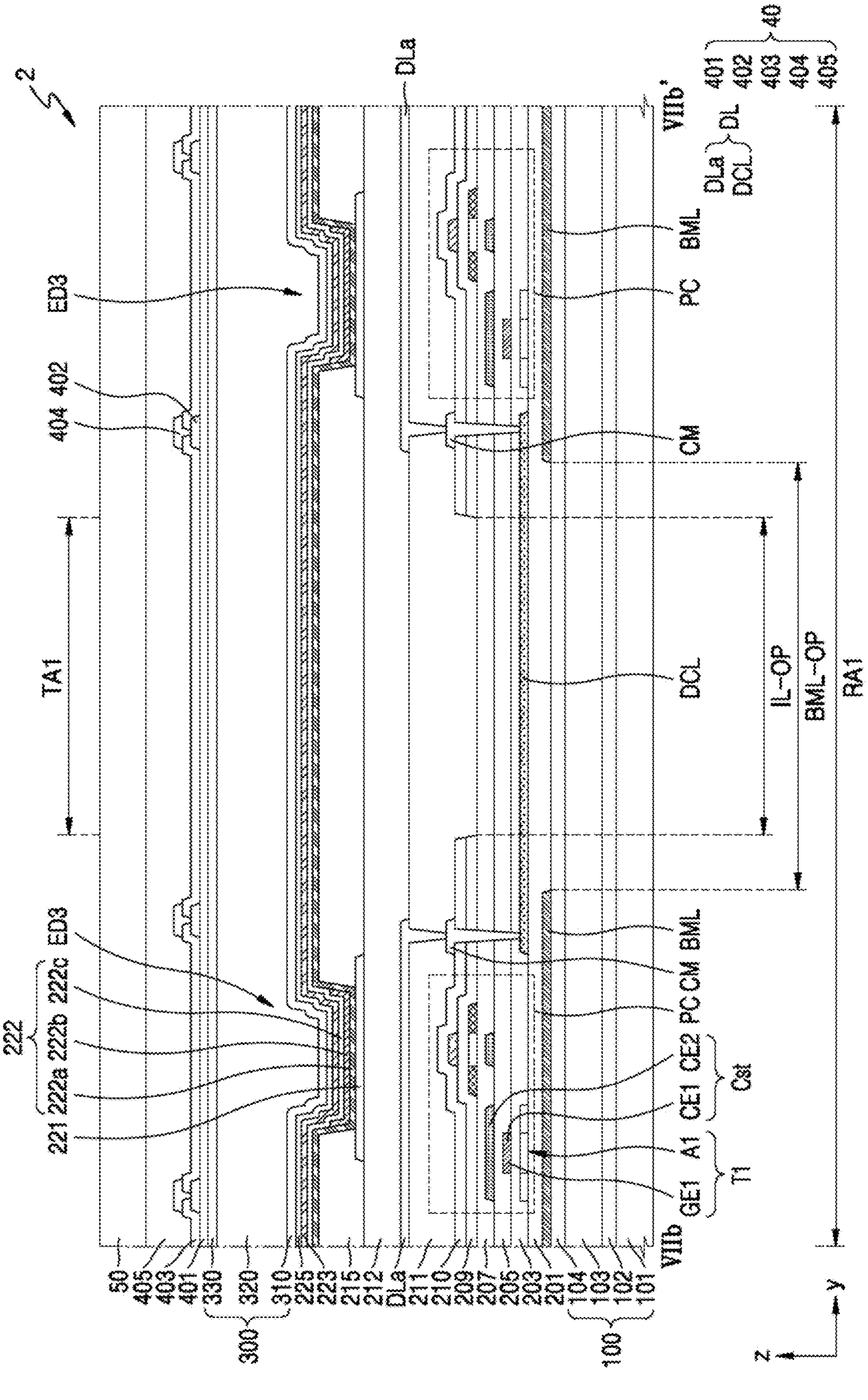
FIG. 13 is a cross-sectional view illustrating a part of the display panel, taken along the line VIIb-VIIb' of FIG. 6, according to an embodiment.

FIG. 13 is a cross-sectional view illustrating a part of the display panel, taken along the line VIIb-VIIb' of FIG. 6, according to one or more embodiments.

The data line DL extending in one direction (e.g., a ty direction) in the first area RA1 described with reference to FIG. 6 may pass through the first transmissive area TA1 (see FIG. 6), and may overlap the opening BML-OP of the bottom metal layer BML and/or the opening IL-OP of at least one inorganic insulating layer as shown in FIG. 13. Because a structure of FIG. 13 is the same as the structure described with reference to FIG. 7, the same elements are denoted by the same reference numerals and a repeated description thereof will be omitted.

The data line DL may include portions DLa located on an organic insulating layer, for example, the first organic insulating layer 211, to be spaced from each other with the opening IL-OP of the at least one inorganic insulating layer therebetween, and a portion (hereinafter, referred to as a connecting portion) DCL that electrically connects the portions DLa.

The portion DLa of the data line DL located on the first organic insulating layer 211 may be electrically connected to the connecting portion DCL through a connection metal CM located between the connecting portion DCL and the portion DLa. The connection metal CM may be located on the third interlayer insulating layer 210. The connecting portion DCL may be located under the opening IL-OP of the at least one inorganic insulating layer. For example, the connecting portion DCL may be located on the substrate 100 and the buffer layer 201 and may be located under the opening IL-OP of the at least one inorganic insulating layer. In one or more embodiments, the connecting portion DCL may be located on the same layer (e.g., on the first gate insulating layer 203) and may include the same material as the first gate electrode GE1 of the first transistor T1 and/or the lower electrode CE1 of the storage capacitor Cst. An insulating layer, for example, the first interlayer insulating layer 205 and the second interlayer insulating layer 207, may be located between the connecting portion DCL and the opening IL-OP of the at least one inorganic insulating layer.

Although, in one or more embodiments, the connecting portion DCL is located on the same layer and includes the same material as the first gate electrode GE1 of the first transistor T1 and/or the lower electrode CE1 of the storage capacitor Cst, the present disclosure is not limited thereto. For example, as shown in FIG. 13, the connecting portion DCL may be located on a different layer and may include a different material from the first gate electrode GE1 of the first transistor T1 and the lower electrode CE1 of the storage capacitor Cst. Another embodiment will be described below with reference to FIG. 14.

Although the display panel 2 in FIG. 13 includes the same structure as the structure of FIG. 7, the present disclosure is not limited thereto. In one or more embodiments, the display panel 2 of FIG. 13 may further include an etch stopper layer and an anti-deposition layer described with reference to FIG. 8.

Figure 14:
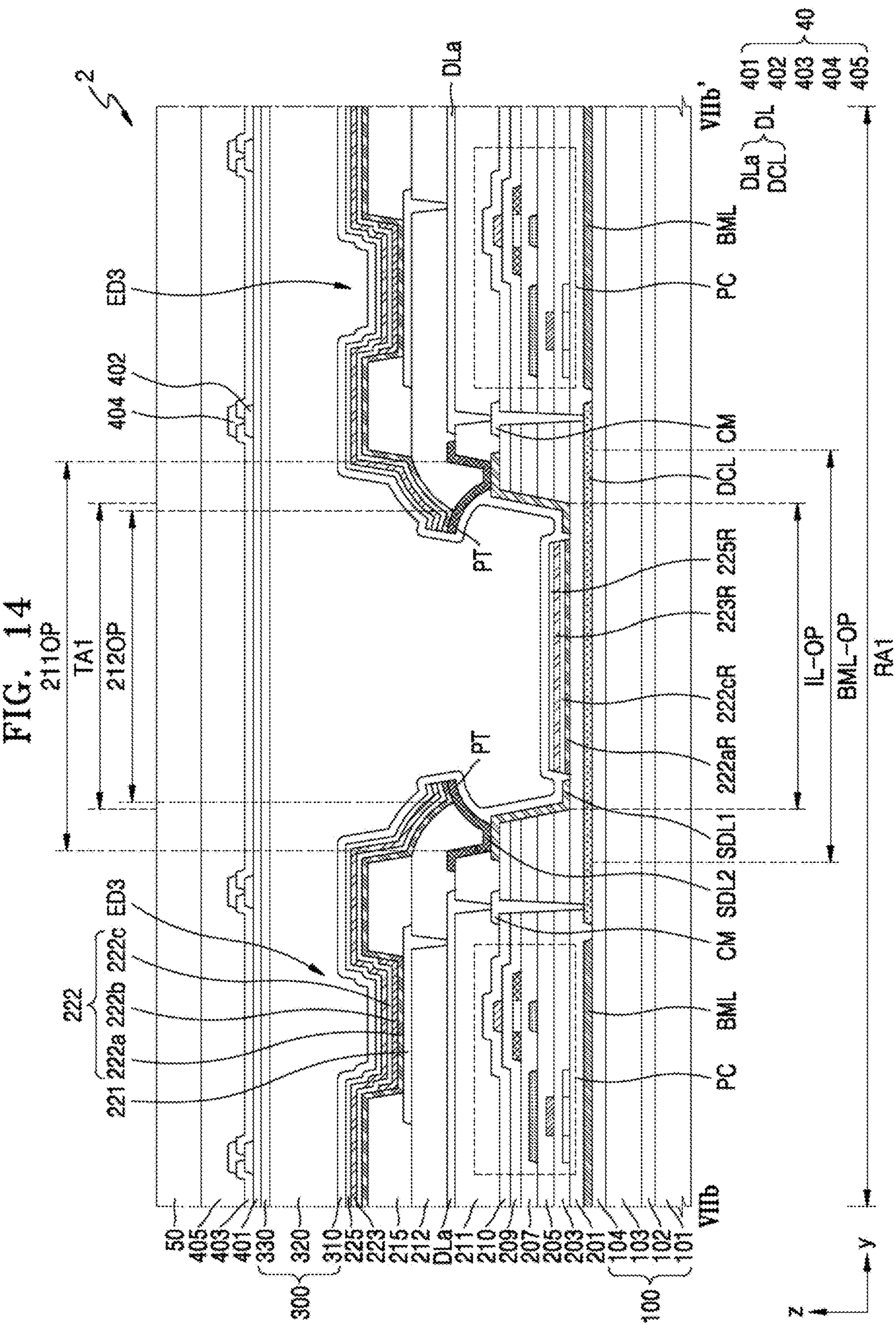
FIG. 14 is a cross-sectional view illustrating a part of a display panel, taken along the line VIIb-VIIb' of FIG. 6, according to one or more embodiments.

FIG. 14 is a cross-sectional view illustrating a part of a display panel taken along the line VIIb-VIIb' of FIG. 6 according to one or more embodiments.

Referring to FIG. 14, the connecting portion DCL of the data line DL may be located on the same layer (e.g., a top surface of the substrate 100) as the bottom metal layer BML, and may include the same material as the bottom metal layer BML. Because a structure of FIG. 14 is the same as the structure described with reference to FIG. 11, the same elements are denoted by the same reference numerals and a repeated description thereof will be omitted.

The portion DLa of the data line DL located on the first organic insulating layer 211 may be electrically connected to the connecting portion DCL through the connection metal CM located between the connecting portion DCL and the portion DLa. The connection metal CM may be located on the third interlayer insulating layer 210. The connecting portion DCL may be located under the opening IL-OP of at least one inorganic insulating layer. For example, the connecting portion DCL may be located between the substrate 100 and the buffer layer 201. An insulating layer, for example, the buffer layer 201, may be located between the connecting portion DCL and the opening IL-OP of the at least one inorganic insulating layer.

When a structure of the first conductive layer SDL1 and the second conductive layer SDL2 is located as shown in FIG. 14, a structure for connection between the portion DLa and the connecting portion DCL of the data line DL may be located opposite to the opening IL-OP with the structure of the first conductive layer SDL1 and the second conductive layer SDL2 therebetween. For example, a contact structure between the portion DLa of the data line DL and the connection metal CM and a contact structure between the connection metal CM and the connecting portion DCL may be located opposite to the opening IL-OP with the structure of the first conductive layer SDL1 and the second conductive layer SDL2 therebetween.

Figure 15:
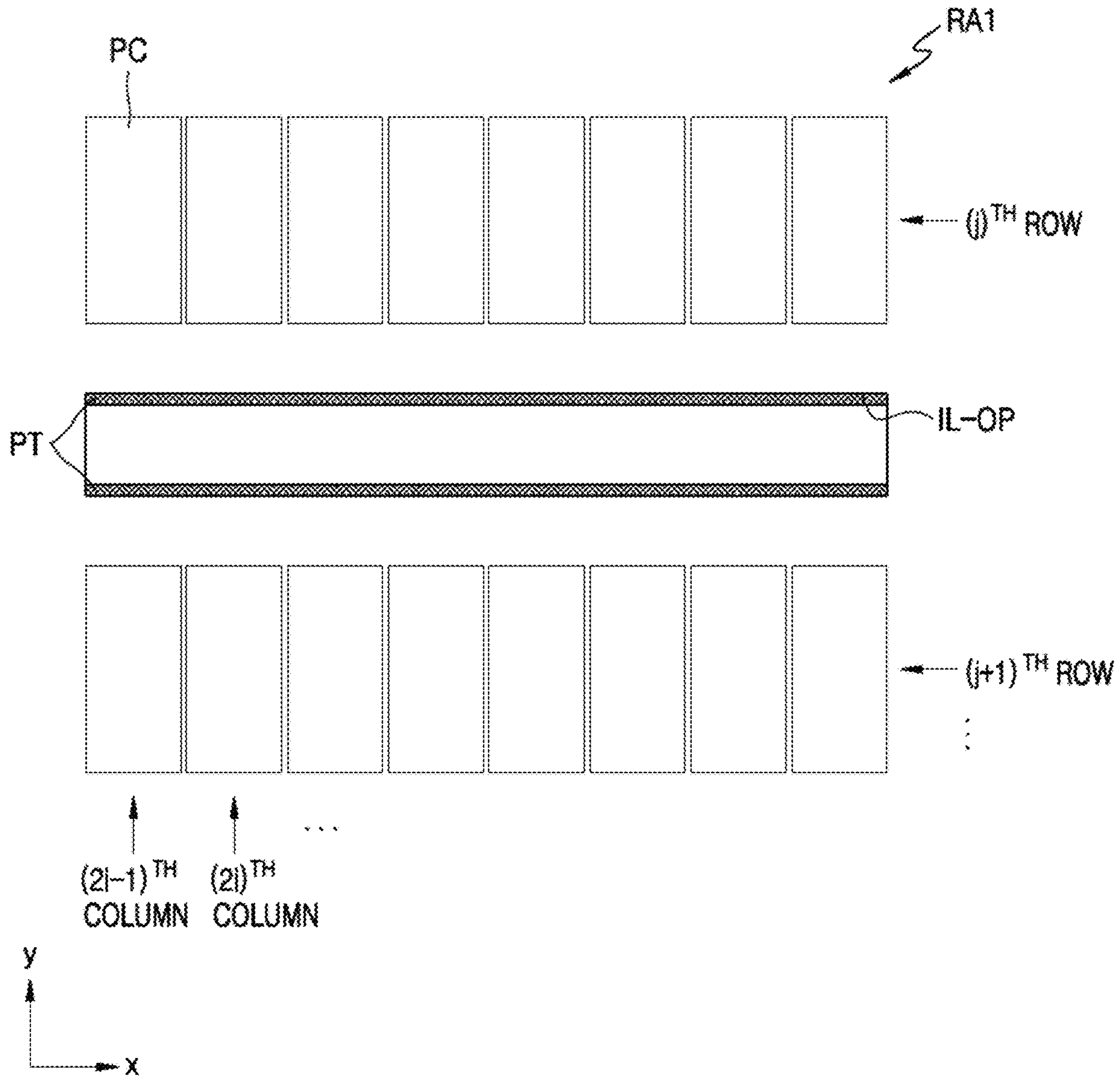
FIG. 15 is a plan view illustrating sub-pixel circuits, an opening of at least one inorganic insulating layer, and a tip of a second conductive layer located in a first area of a display panel, according to one or more embodiments.

FIG. 15 is a plan view illustrating sub-pixel circuits, an opening of at least one inorganic insulating layer, and a tip of a second conductive layer located in a first area of a display panel, according to one or more embodiments.

Referring to FIGS. 12 and 15, the opening IL-OP of at least one inorganic insulating layer located between the sub-pixel circuits PC of a $(j)^{th}$ row and the sub-pixel circuits PC of a $(j+1)^{th}$ row arranged in the first direction (e.g., the x direction) may extend in the first direction (e.g., the +x direction). The tip PT of the second conductive layer SDL2 (see FIG. 12) protruding toward the opening IL-OP of the at least one inorganic insulating layer may extend in the first direction (e.g., the +x direction) as shown in FIG. 15.

Figure 16:
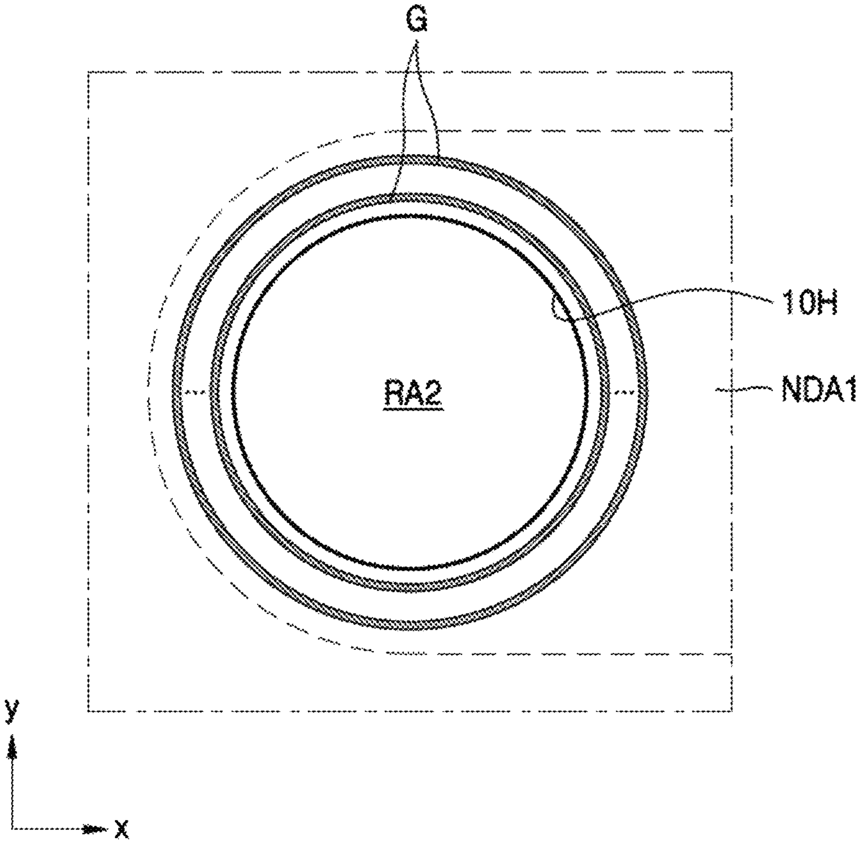
FIG. 16 is a plan view illustrating a second area of a display panel and a portion around the second area, according to one or more embodiments.
Figure 17:
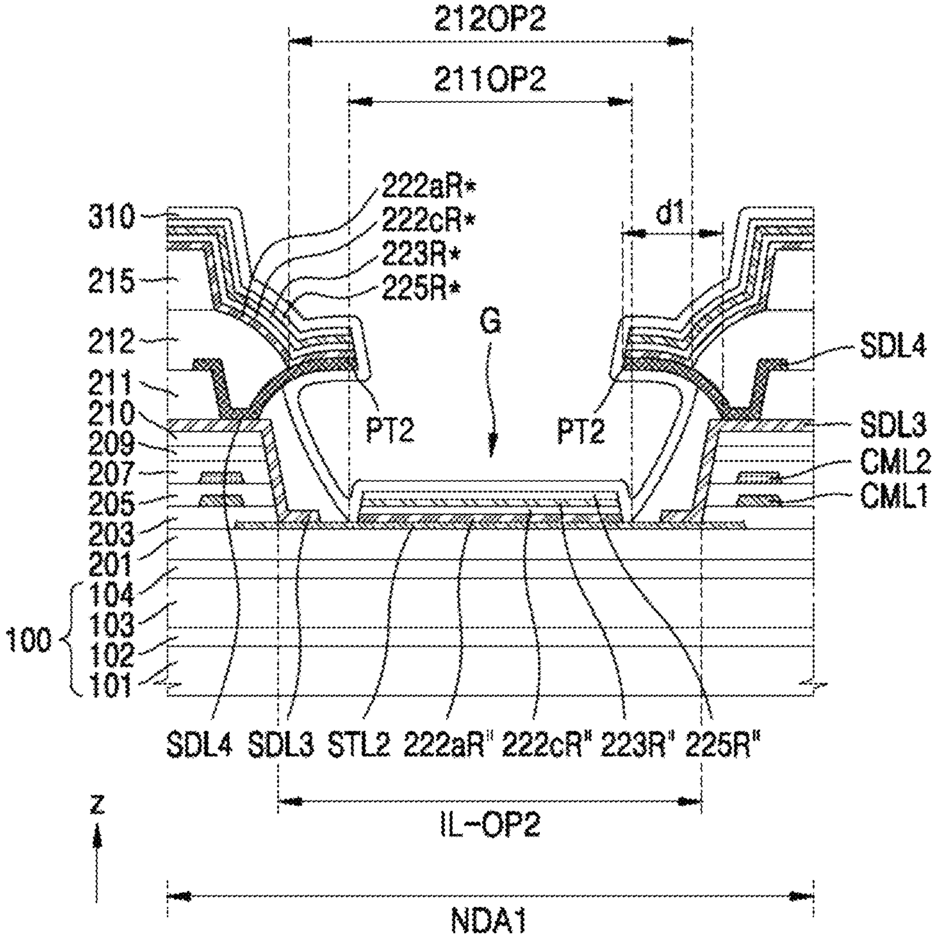
FIG. 17 is a cross-sectional view schematically illustrating a groove of FIG. 16.

FIG. 16 is a plan view illustrating a second area of a display panel and a portion around the second area, according to one or more embodiments. FIG. 17 is a cross-sectional view schematically illustrating a groove of FIG. 16.

Referring to FIG. 16, the second area RA2 may be surrounded by the first non-display area NDA1 (see FIG. 1A). The second area RA2 is an area corresponding to the opening 10H of the display layer 10 (see FIG. 2A) as described with reference to FIG. 2A. In other words, the second area RA2 is an area corresponding to an opening penetrating from a top surface to a bottom surface of a substrate.

A groove G having a closed-loop shape and surrounding the second area RA2 may be located in the first non-display area NDA1. For example, a plurality of grooves G having different diameters may be arranged to be spaced from each other.

The groove G may include an opening (hereinafter, referred to as a second opening IL-OP2) passing through inorganic insulating layers on the buffer layer 201 as shown in FIG. 17. The second opening IL-OP2 may be formed by removing a part of each of the first gate insulating layer 203, the first interlayer insulating layer 205, the second interlayer insulating layer 207, the second gate insulating layer 209, and the third interlayer insulating layer 210.

An overhang structure may be formed around the second opening IL-OP2. For example, a fourth conductive layer SDL4 on a third conductive layer SDL3 may include a tip (hereinafter, referred to as a second tip PT2) protruding toward the second opening IL-OP2 or the center of the groove G.

A first portion of the third conductive layer SDL3 may be located on a top surface of the third interlayer insulating layer 210, and a second portion of the third conductive layer SDL3 located opposite to the first portion may extend toward the second opening IL-OP2. The third conductive layer SDL3 may overlap side surfaces of inorganic insulating layers facing the second opening IL-OP2. For example, the third conductive layer SDL3 may directly contact the side surfaces of the inorganic insulating layers facing the second opening IL-OP2. The first portion of the third conductive layer SDL3 may directly contact a top surface of the third interlayer insulating layer 210, and the second portion of the third conductive layer SDL3 may directly contact a bottom surface of the second opening IL-OP2 (e.g., a top surface of a second etch stopper layer STL2). The second etch stopper layer STL2 may include the same material as the first semiconductor layer A1 (see FIG. 5) of the first transistor T1 (see FIG. 5) described with reference to FIG. 5.

A first portion of a fourth conductive layer SDL4 may be located on a top surface of the first organic insulating layer 211, and a second portion of the fourth conductive layer SDL4 may protrude toward the second opening IL-OP2 or the groove G to form an eaves structure or an overhang structure.

The first and second common layers 222*a* and 222*c*, the counter electrode 223, and the upper layer 225 may be separated around the second tip PT2 due to the eaves structure or the overhang structure of the second tip PT2 of the fourth conductive layer SDL4.

The first and second common layers 222*a* and 222*c* may respectively include third portions 222*a*R" and 222*c*R" overlapping the second opening IL-OP2 and fourth portions 222*a*R* and 222*c*R* located on the second tip PT2 of the fourth conductive layer SDL4. The third portions 222*a*R" and 222*c*R" and the fourth portions 222*a*R* and 222*c*R* of the first and second common layers 222*a* and 222*c* may be located at different levels and may be separated from each other.

The counter electrode 223 may include a third portion 223R" overlapping the second opening IL-OP2 and a fourth portion 223R* located on the second tip PT2 of the fourth conductive layer SDL4. The third portion 223R" and the fourth portion 223R* of the counter electrode 223 may be located at different levels and may be separated from each other.

The upper layer 225 may include a third portion 225R" overlapping the second opening IL-OP2 and a fourth portion 225R* located on the second tip PT2 of the fourth conductive layer SDL4. The third portion 225R" and the fourth portion 225R* of the upper layer 225 may be located at different levels and may be separated from each other.

When openings (e.g., 10H, 40H, and 50H of FIG. 2A) are formed in the second area RA2 as described with reference to FIGS. 2A and 16, moisture introduced through the second area RA2 that is an opening may pass through the first non-display area NDA1 through a common layer that is an organic material layer, and may travel to a light-emitting diode. However, according to one or more embodiments, because the first and second common layers 222*a* and 222*c* are separated into a plurality of portions due to the structure of the second tip PT2 extending toward the groove G, the above-described moisture travel path may be blocked. To this end, a length d1 of the second tip PT2 may range from about 5 μm to about 7 μm, for example, about 7 μm. The length d1 of the second tip PT2 corresponds to a horizontal distance (e.g., a horizontal distance in the x direction parallel to a top surface of the substrate 100) from an edge (e.g., an edge close to the groove G) of a bottom surface of the fourth conductive layer SDL4 contacting the third conductive layer SDL3 to an edge of the second tip PT2. Unlike the second tip PT2, because the tip PT of the second conductive layer SDL2 described with reference to FIG. 11 is not a structure for blocking the above-described moisture travel path, a length d2 of the tip PT of the second conductive layer SDL2 of FIG. 11 may be less than the length d1 of the second tip PT2. For example, the length d2 of the tip PT of the second conductive layer SDL2 of FIG. 11 may range from about 1 μm to about 4 μm, for example, about 2.5 μm. The length d2 of the tip PT of the second conductive layer SDL2 corresponds to a horizontal distance (e.g., a horizontal distance in the x direction parallel to the top surface of the substrate 100) from an edge (e.g., an edge close to the opening IL-OP) of a bottom surface of the second conductive layer SDL2 contacting the first conductive layer SDL1 to an edge of the tip PT.

A stacked structure of the first gate insulating layer 203, the first interlayer insulating layer 205, the second interlayer insulating layer 207, the second gate insulating layer 209, and the third interlayer insulating layer 210 located around the second opening IL-OP2 may further include conductive layers. For example, a first conductive layer CML1 may be located between the first gate insulating layer 203 and the first interlayer insulating layer 205, and a second conductive layer CML2 may be located between the first interlayer insulating layer 205 and the second interlayer insulating layer 207. Because the first conductive layer CML1 and the second conductive layer CML2 are further located, a vertical distance from the top surface of the substrate 100 to the fourth conductive layer SDL4 may increase in a direction (e.g., the +z direction) perpendicular to the top surface of the substrate 100. In other words, a vertical distance from the top surface of the substrate 100 to the second tip PT2 may increase. For example, a vertical distance from the top surface of the substrate 100 to the second tip PT2 may be greater than a vertical distance from the top surface of the substrate 100 to the tip PT (see FIG. 11 or 12) described with reference to FIG. 11 or 12.

The first organic insulating layer 211 and the second organic insulating layer 212 may respectively include second openings 211OP2 and 212OP2 overlapping the second opening IL-OP2 or the groove G in the first non-display area NDA1. The first inorganic encapsulation layer 310 may be continuously formed through the second openings 211OP2 and 212OP2 of the first organic insulating layer 211 and the second organic insulating layer 212. The second opening 211OP2 of the first organic insulating layer 211 and the second opening 212OP2 of the second organic insulating layer 212 may have different widths. For example, a width of the second opening 211OP2 of the first organic insulating layer 211 may be less than a width of the second opening 212OP2 of the second organic insulating layer 212.

The first inorganic encapsulation layer 310 may continuously overlap a stacked structure of the fourth portion 225R* of the upper layer 225, the fourth portion 223R* of the counter electrode 223, and the fourth portions 222*a*R* and 222*c*R* of the first and second common layers 222*a* and 222*c*, a side surface and a bottom surface of the second tip PT2 of the fourth conductive layer SDL4, a side surface of the first organic insulating layer 211 located under the second tip PT2 and defining the second opening 211OP2, and a stacked structure of the third portion 225R" of the upper layer 225, the third portion 223R" of the counter electrode 223, and the third portions 222*a*R" and 222*c*R" of the first and second common layers 222*a* and 222*c*.

According to one or more embodiments, a light transmittance of a transmissive area may be ensured, and the influence of light passing through the transmissive area on transistors around the transmissive area may be prevented. These effects are examples, and do not limit the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and their equivalents.

What is claimed is:

1. A display panel comprising:

a substrate;

a first sub-pixel circuit and a second sub-pixel circuit located on the substrate and spaced from each other with a transmissive area therebetween;

a first sub-pixel electrode electrically connected to the first sub-pixel circuit;

a second sub-pixel electrode electrically connected to the second sub-pixel circuit and spaced from the first sub-pixel electrode with the transmissive area therebetween;

a counter electrode overlapping the first sub-pixel electrode and the second sub-pixel electrode;

a common layer comprising an organic material, and interposed between the first sub-pixel electrode and the counter electrode and between the second sub-pixel electrode and the counter electrode; and a plurality of inorganic insulating layers interposed between the substrate and the first sub-pixel electrode and between the substrate and the second sub-pixel electrode, wherein at least one inorganic insulating layer from among the plurality of inorganic insulating layers comprises an opening corresponding to the transmissive area, and wherein the display panel further comprises an overhang structure comprising a tip extending toward the opening of the at least one inorganic insulating layer.

2. The display panel of claim 1, wherein the overhang structure comprises:

a first conductive layer comprising a first portion located on a top surface of the at least one inorganic insulating layer and a second portion extending toward the opening of the at least one inorganic insulating layer; and a second conductive layer located on the first conductive layer and comprising the tip protruding toward the opening of the at least one inorganic insulating layer, wherein the first conductive layer and the second conductive layer are each located on opposite sides of the opening of the at least one inorganic insulating layer.

3. The display panel of claim 2, wherein the common layer comprises a first portion overlapping the opening of the at least one inorganic insulating layer, and a second portion located on the tip of the second conductive layer and separated from the first portion of the common layer.

4. The display panel of claim 2, wherein the counter electrode comprises a first portion overlapping the opening of the at least one inorganic insulating layer, and a second portion located on the tip of the second conductive layer and separated from the first portion of the counter electrode.

5. The display panel of claim 1, wherein the counter electrode comprises an opening overlapping the opening of the at least one inorganic insulating layer.

6. The display panel of claim 2, further comprising a lithium fluoride (LiF) layer or a capping layer located on the counter electrode, wherein the LiF layer or the capping layer comprises a first portion overlapping the opening of the at least one inorganic insulating layer, and a second portion located on the tip of the second conductive layer and separated from the first portion of the LiF layer or the capping layer.

7. The display panel of claim 2, further comprising a first inorganic encapsulation layer on the counter electrode, an organic encapsulation layer on the first inorganic encapsulation layer, and a second inorganic encapsulation layer on the organic encapsulation layer, wherein the first inorganic encapsulation layer continuously extends to overlap the tip of the second conductive layer, a part of the first conductive layer on a side surface of the at least one inorganic insulating layer facing the opening of the at least one inorganic insulating layer, and the opening of the at least one inorganic insulating layer.

8. The display panel of claim 5, further comprising an anti-deposition layer located on the common layer and overlapping the opening of the counter electrode.

9. The display panel of claim 8, wherein the anti-deposition layer comprises a plurality of portions separated at or near the tip.

10. The display panel of claim 1, further comprising an etch stopper layer located under the at least one inorganic insulating layer.

11. The display panel of claim 10, wherein each of the first sub-pixel circuit and the second sub-pixel circuit comprises:

a silicon-based transistor comprising a silicon-based semiconductor layer; and an oxide-based transistor comprising an oxide-based semiconductor layer, wherein the etch stopper layer comprises a same material as the silicon-based semiconductor layer or the oxide-based semiconductor layer.

12. The display panel of claim 1, further comprising an organic insulating layer interposed between the plurality of inorganic insulating layers and the first sub-pixel electrode and between the plurality of inorganic insulating layers and the second sub-pixel electrode.

13. The display panel of claim 12, wherein the organic insulating layer comprises an opening overlapping the opening of the at least one inorganic insulating layer.

14. The display panel of claim 1, further comprising a data line electrically connected to the first sub-pixel circuit and the second sub-pixel circuit, wherein the data line comprises:

a first portion on the plurality of inorganic insulating layers; and a connecting portion overlapping the opening of the at least one inorganic insulating layer, located under the opening, and electrically connected to the first portion.

15. An electronic apparatus comprising:

a display panel comprising a first component area and a display area around the first component area; and a first component located under the display panel and overlapping the first component area, wherein the display panel comprises:

a substrate;

a first sub-pixel circuit and a second sub-pixel circuit located on the substrate to correspond to the first component area and spaced from each other with a transmissive area therebetween;

a first sub-pixel electrode electrically connected to the first sub-pixel circuit;

a second sub-pixel electrode electrically connected to the second sub-pixel circuit and spaced from the first sub-pixel electrode with the transmissive area therebetween;

a counter electrode overlapping the first sub-pixel electrode and the second sub-pixel electrode;

a common layer comprising an organic material, and interposed between the first sub-pixel electrode and the counter electrode and between the second sub-pixel electrode and the counter electrode;

a plurality of inorganic insulating layers interposed between the substrate and the first sub-pixel electrode and between the substrate and the second sub-pixel electrode, at least one inorganic insulating layer from among the plurality of inorganic insulating layers comprising an opening corresponding to the transmissive area;

an organic insulating layer interposed between the plurality of inorganic insulating layers and the first sub-pixel electrode and between the plurality of inorganic insulating layers and the second sub-pixel electrode;

a first conductive layer comprising a first portion located on a top surface of the at least one inorganic insulating layer and a second portion extending toward the opening of the at least one inorganic insulating layer; and a second conductive layer located on the first conductive layer and comprising a tip protruding toward the opening of the at least one inorganic insulating layer, wherein the first conductive layer and the second conductive layer are each located on opposite sides of the opening of the at least one inorganic insulating layer.

16. The electronic apparatus of claim 15, wherein the organic insulating layer is on the second conductive layer and comprises an opening overlapping the opening of the at least one inorganic insulating layer.

17. The electronic apparatus of claim 15, wherein the common layer comprises a first portion overlapping the opening of the at least one inorganic insulating layer, and a second portion located on the tip of the second conductive layer and separated from the first portion of the common layer.

18. The electronic apparatus of claim 15, wherein the counter electrode comprises a first portion overlapping the opening of the at least one inorganic insulating layer, and a second portion located on the tip of the second conductive layer and separated from the first portion of the counter electrode.

19. The electronic apparatus of claim 15, wherein the counter electrode comprises an opening overlapping the opening of the at least one inorganic insulating layer.

20. The electronic apparatus of claim 19, wherein the display panel further comprises an anti-deposition layer located on the common layer and overlapping the opening of the counter electrode.

21. The electronic apparatus of claim 15, wherein the display panel further comprises a lithium fluoride (LiF) layer or a capping layer located on the counter electrode, wherein the LiF layer or the capping layer comprises a first portion overlapping the opening of the at least one inorganic insulating layer, and a second portion located on the tip of the second conductive layer and separated from the first portion of the LiF layer or the capping layer.

22. The electronic apparatus of claim 15, wherein the display panel further comprises a first inorganic encapsulation layer on the counter electrode, an organic encapsulation layer on the first inorganic encapsulation layer, and a second inorganic encapsulation layer on the organic encapsulation layer, wherein the first inorganic encapsulation layer continuously extends to overlap the tip of the second conductive layer, a part of the first conductive layer located on a side surface of the at least one inorganic insulating layer facing the opening of the at least one inorganic insulating layer, and the opening of the at least one inorganic insulating layer.

23. The electronic apparatus of claim 15, wherein the display panel further comprises an etch stopper layer on a bottom surface of the opening.

24. The electronic apparatus of claim 23, wherein each of the first sub-pixel circuit and the second sub-pixel circuit comprises:

a silicon-based transistor comprising a silicon-based semiconductor layer; and an oxide-based transistor comprising an oxide-based semiconductor layer, wherein the etch stopper layer comprises a same material as the silicon-based semiconductor layer or the oxide-based semiconductor layer.

25. The electronic apparatus of claim 15, wherein the display panel further comprises a data line electrically connected to each of the first sub-pixel circuit and the second sub-pixel circuit, wherein the data line comprises:

a first portion electrically connected to the first sub-pixel circuit;

a second portion electrically connected to the second sub-pixel circuit; and a third portion electrically connected to each of the first portion and the second portion of the data line, wherein the third portion overlaps the opening of the at least one inorganic insulating layer.

26. The electronic apparatus of claim 15, wherein the first component comprises a sensor or a camera.

* * * * *